(12) United States Patent
Lee et al.

(10) Patent No.: US 12,507,355 B2
(45) Date of Patent: Dec. 23, 2025

(54) DISPLAY DEVICE

(71) Applicant: Samsung Display Co., LTD., Yongin-si (KR)

(72) Inventors: Sangjun Lee, Yongin-si (KR); Beomjin Kim, Yongin-si (KR); Jaeho Ahn, Yongin-si (KR); Cheol Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 137 days.

(21) Appl. No.: 18/379,278

(22) Filed: Oct. 12, 2023

(65) Prior Publication Data
US 2024/0237240 A1 Jul. 11, 2024

(30) Foreign Application Priority Data
Jan. 5, 2023 (KR) .......................... 10-2023-0001597

(51) Int. Cl.
G09F 9/30 (2006.01)
H05K 5/02 (2006.01)

(52) U.S. Cl.
CPC ................................ H05K 5/0217 (2013.01)

(58) Field of Classification Search
None
See application file for complete search history.

(56) References Cited

U.S. PATENT DOCUMENTS

| 9,519,313 | B2 | 12/2016 | Kim et al. | |
|---|---|---|---|---|
| 10,671,179 | B2* | 6/2020 | Xia | G06F 3/03547 |
| 2016/0161983 | A1* | 6/2016 | Lee | G06F 1/1652 |
| | | | | 361/749 |
| 2019/0182947 | A1* | 6/2019 | Xiang | H05K 1/028 |
| 2021/0272486 | A1* | 9/2021 | Khachatryan | G09F 9/301 |

FOREIGN PATENT DOCUMENTS

KR 102339290 B1 12/2021

* cited by examiner

Primary Examiner — Xanthia C Relford
(74) Attorney, Agent, or Firm — CANTOR COLBURN LLP

(57) ABSTRACT

A display device includes a first roller extending in a first direction and provided with a first tunnel defined therein to extend in the first direction and rotates about a first rotational axis parallel to the first direction, a display module connected to the first roller and wound around or unwound from the first roller, an inner roller extending in the first direction and disposed in the first tunnel and which rotates about the first rotational axis, a first gear connected to each of opposite sides of the inner roller in the first direction, where the plurality of first gears is disposed on an outer surface of the first roller, and a first elastic body disposed in the first tunnel and connected to the inner roller and the first roller.

21 Claims, 21 Drawing Sheets

DISPLAY DEVICE

This application claims priority to Korean Patent Application No. 10-2023-0001597, filed on Jan. 5, 2023, and all the benefits accruing therefrom under 35 U.S.C. § 119, the content of which in its entirety is herein incorporated by reference.

BACKGROUND

1. Field

Embodiments of the disclosure described herein relate to a display device.

2. Description of the Related Art

An electronic device, such as a smart phone, a digital camera, a notebook computer, a car navigation unit, a smart television, or the like, which provides an image to a user includes a display device for displaying an image. The display device generates an image and provides the image to the user through a display screen.

With the development of display device technology, various forms of display devices are being developed. For example, various flexible display devices that can be curved, folded, or rolled are being developed. The flexible display devices may be easy to carry and may improve user convenience.

Among the flexible display devices, a rollable display device includes a display module, a roller around which the display module is wound, and a housing that accommodates the display module and the roller. The display module may be withdrawn from or inserted into the housing by rotation of the roller.

An elastic body for easily winding or unwinding the display module may be included in the roller.

SUMMARY

Embodiments of the disclosure provide a display device.

According to an embodiment, a display device includes a first roller extending in a first direction and provided with a first tunnel defined therein to extend in a first direction, where the first roller rotates about a first rotational axis parallel to the first direction, a display module connected to the first roller and wound around or unwound from the first roller, an inner roller extending in the first direction and disposed in the first tunnel, where the inner roller rotates about the first rotational axis, a first gear connected to each of opposite sides of the inner roller in the first direction, where the first gear is disposed on an outer surface of the first roller, and a first elastic body disposed in the first tunnel and connected to the inner roller and the first roller.

According to an embodiment, a display device includes a first roller part extending in a first direction, a display module connected to the first roller part and wound around or unwound from the first roller part, a second roller part extending in the first direction and spaced apart from the first roller part in a second direction crossing the first direction, where the second roller part includes a second gear disposed on each of opposite sides thereof in the first direction, and a third roller part extending in the first direction and disposed between the first roller part and the second roller part, where the third roller part includes a third gear disposed on each of opposite sides thereof in the first direction. In such an embodiment, the first roller part includes a first roller provided with a first tunnel defined therein to extend in the first direction, where the first roller rotates about a first rotational axis parallel to the first direction, an inner roller disposed in the first tunnel and extending in the first direction, a first gear connected to each of opposite sides of the inner roller in the first direction, where the first gear is disposed on an outer surface of the first roller, and a first elastic body disposed in the first tunnel and connected to the inner roller and the first roller, where the first, second, and third gears are engaged with each other to rotate.

BRIEF DESCRIPTION OF THE DRAWINGS

The above and other features of the disclosure will become apparent by describing in detail embodiments thereof with reference to the accompanying drawings.

DETAILED DESCRIPTION

Figure 1:
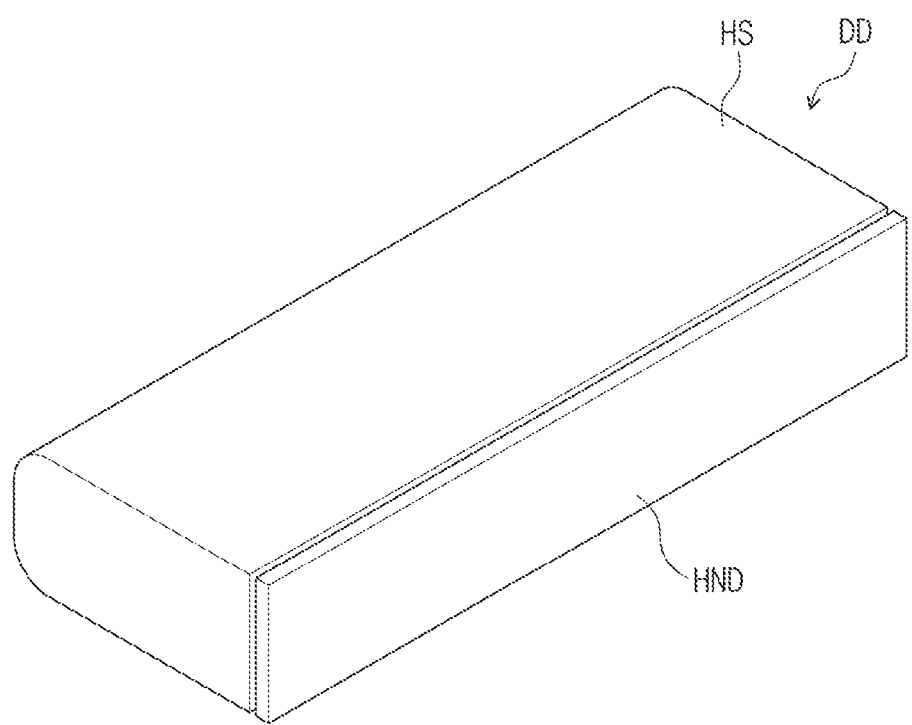
FIG. 1 is a perspective view of a display device according to an embodiment of the disclosure.
Figure 1:
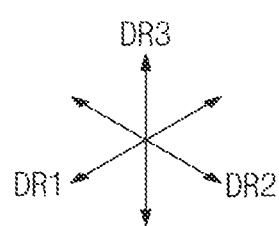

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

When one element or layer is referred to as being "on" another element or layer, it can be directly on the other element or layer, or intervening elements or layers may be present. In contrast, when one element is referred to as being "directly on" another element or layer, there are no intervening elements or layers present.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "below", "beneath", "lower", "above", "upper" and the like, may be used to easily describe a correlation between one element or component and another element or component as illustrated in the drawings. The spatially relative terms should be understood as terms including different directions of an element during use or operation in addition to the direction illustrated in the drawings.

Although the terms "first," "second," and the like are used herein to describe various elements, components, and/or sections, these elements, components, and/or sections should not be limited by these terms. These terms are only used to distinguish one element, component, or section from another element, component, or section. Accordingly, a first element, a first component, or a first section mentioned below could be termed a second element, a second component, or a second section within the spirit and scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments described herein will be described with reference to plan views and sectional views which are ideal schematic views of the disclosure. Accordingly, the forms of illustrative drawings may be changed according to manufacturing technology and/or allowable errors. Embodiments of the disclosure are not limited to specific forms illustrated, but include changes in the forms generated according to manufacturing processes. Regions illustrated in the drawings have schematic properties, and the shapes of the regions illustrated in the drawings illustrate specific forms of regions of devices and are not intended to limit the scope of the disclosure.

Hereinafter, embodiments of the disclosure will be described with reference to the accompanying drawings.

Figure 2:
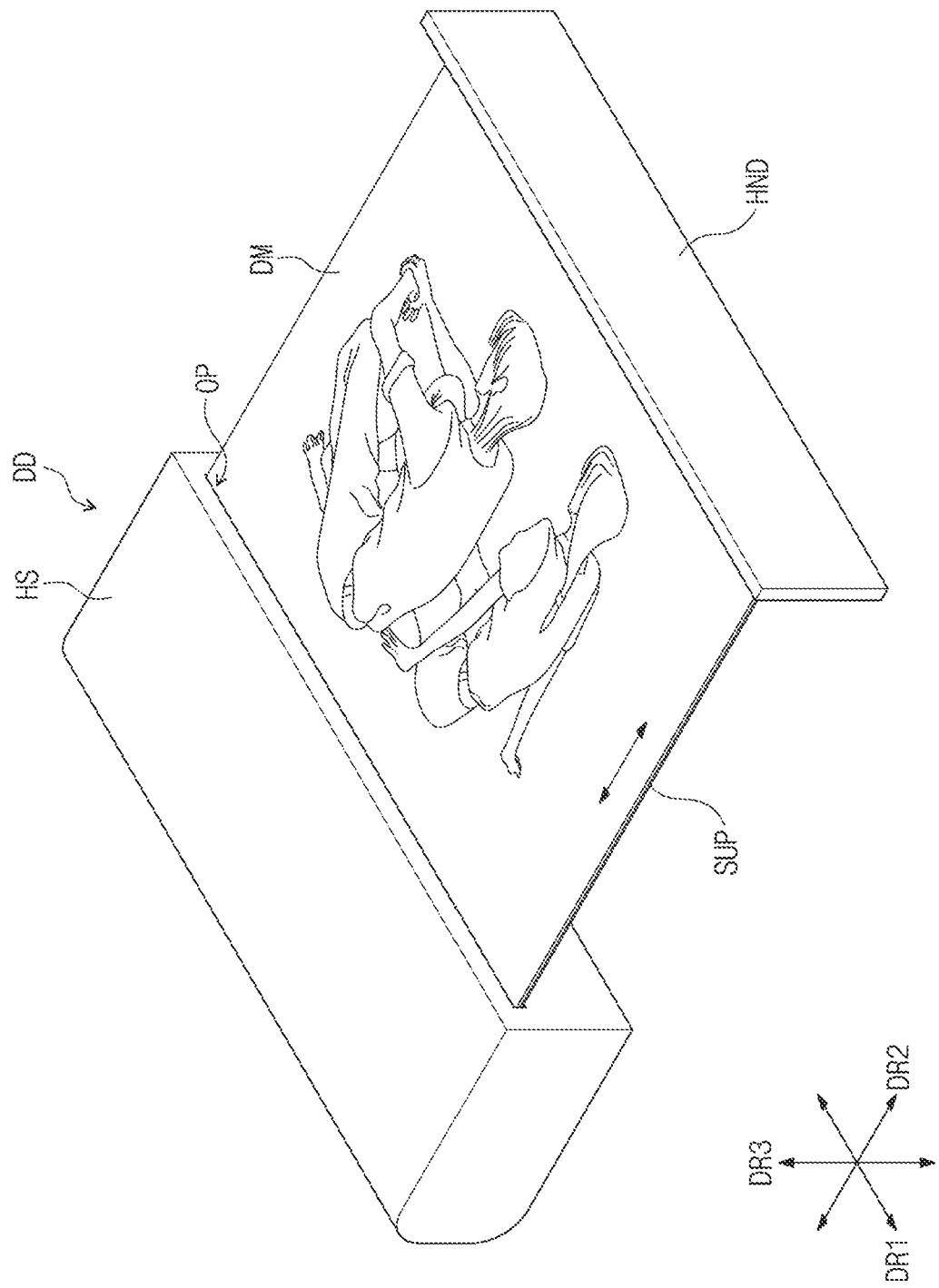
FIG. 2 is a view illustrating a display module exposed outside a housing illustrated in FIG. 1.

FIG. 1 is a perspective view of a display device according to an embodiment of the disclosure. FIG. 2 is a view illustrating a display module exposed outside a housing illustrated in FIG. 1.

Referring to FIGS. 1 and 2, an embodiment of the display device DD may include the housing HS, a handle HND, and the display module DM.

Hereinafter, in this specification, a first direction DR1, a second direction DR2 crossing the first direction DR1, and a third direction DR3 crossing a plane defined by the first and second directions DR1 and DR2 are defined.

The housing HS may extend longer in the first direction DR1 than in the second direction DR2 and the third direction DR3. The housing HS may extend longer in the second direction DR2 than in the third direction DR3.

The handle HND may be disposed on one of two opposing sides of the housing HS in the second direction DR2. The handle HND may be on a plane defined by the first and third directions DR1 and DR3. The handle HND may extend longer in the first direction DR1 than in the third direction DR3. The handle HND may move toward or away from the housing HS in the second direction DR2.

An opening OP may be defined on the one of two opposing sides of the housing HS in the second direction DR2. The handle HND may be disposed adjacent to the opening OP and may move toward or away from the opening OP. One end of the display module DM may be connected to the handle HND through the opening OP.

The display device DD may include support parts SUP that are disposed under the display module DM and that support the display module DM. The support parts SUP may be disposed in the housing HS, and one ends of the support parts SUP may be connected to the handle HND through the opening OP. The support parts SUP will be described below in detail with reference to FIGS. 13A to 14B.

The display module DM and the support parts SUP may be accommodated in the housing HS. The display module DM and the support parts SUP may be withdrawn from or inserted into the housing HS through the opening OP. As the handle HND moves, the display module DM and the support parts SUP may be withdrawn from or inserted into the housing HS.

Figure 3:
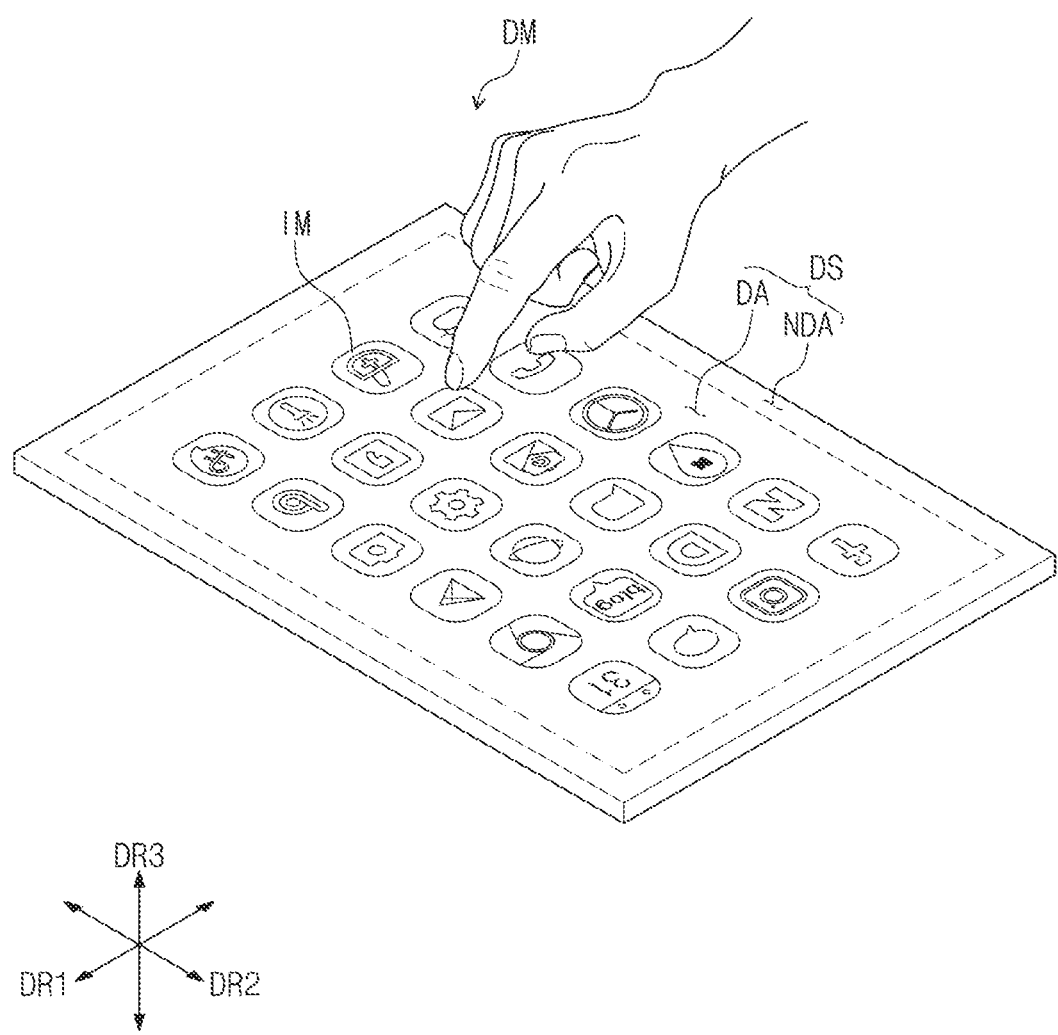
FIG. 3 is a view illustrating an embodiment of the display module illustrated in FIG. 1.
Figure 4:
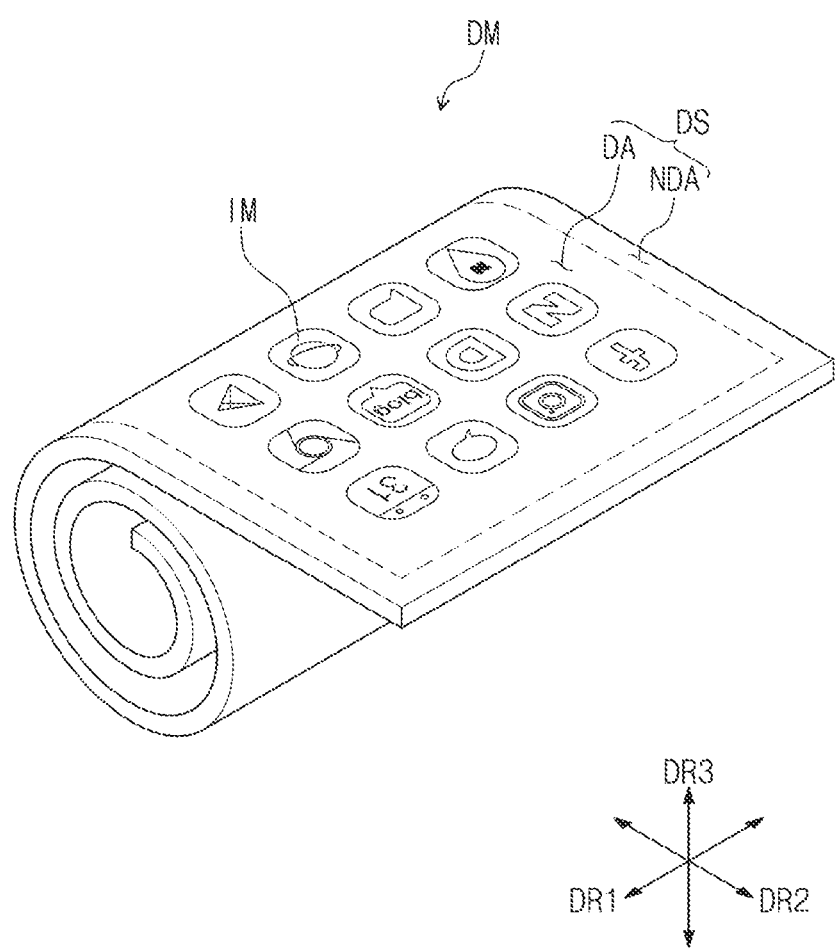
FIG. 4 is a view illustrating an embodiment of the display module illustrated in FIG. 3 in a rolled state.

FIG. 3 is a view illustrating an embodiment of the display module in FIG. 1. FIG. 4 is a view illustrating an embodiment of the display module illustrated in FIG. 3 in a rolled state.

Referring to FIG. 3, in an embodiment, an upper surface of the display module DM may be defined as a display surface DS and may be on a plane defined by the first direction DR1 and the second direction DR2. Images IM generated by the display module DM may be provided to a user through the display surface DS.

The display surface DS may include a display region DA and a non-display region NDA around the display region DA. The display region DA may display an image, and the non-display region NDA may not display an image. The non-display region NDA may surround the display region DA and may define a border of the display module DM that is printed in a predetermined color.

Referring to FIG. 4, an embodiment of the display module DM may be a flexible display module DM. The display module DM may be rolled or unrolled in the second direction DR2. The display module DM may be rolled in a way such that the display surface DS faces toward the outside.

Figure 5:
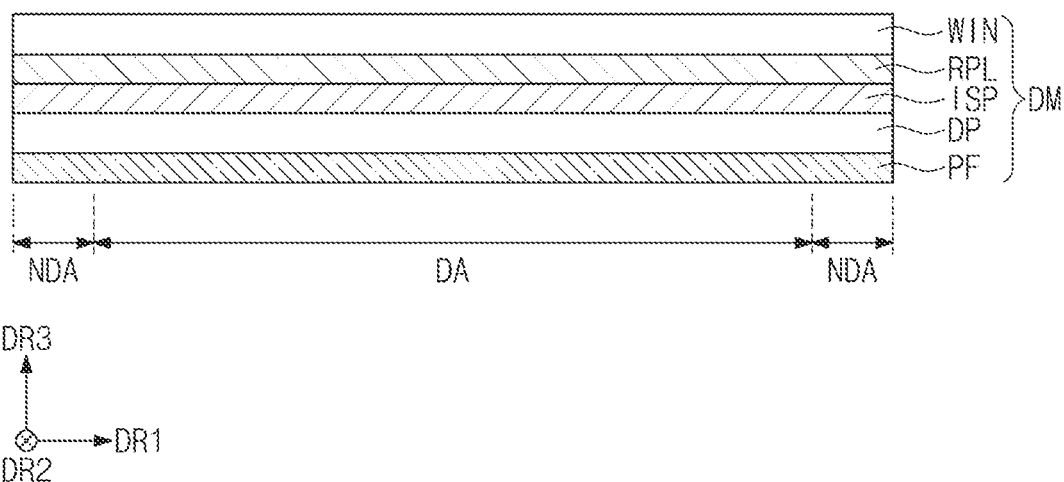
FIG. 5 is a view illustrating a section of a display module illustrated in FIG. 3.

FIG. 5 is a view illustrating a section of the display module illustrated in FIG. 3.

In FIG. 5, a section of the display module DM viewed in the second direction DR2 is illustrated.

Referring to FIG. 5, an embodiment of the display module DM may include a display panel DP, an input sensing unit ISP, an anti-reflection layer RPL, a window WIN, and a panel protection film PF.

The display panel DP may be a flexible display panel. The display panel DP according to an embodiment of the disclosure may be an emissive display panel, but is not particularly limited. In an embodiment, for example, the display panel DP may be an organic light emitting display panel or an inorganic light emitting display panel. An emissive layer of the organic light emitting display panel may include an organic light emitting material. An emissive layer of the inorganic light emitting display panel may include quantum dots, quantum rods, and the like. Hereinafter, for convenience of description, embodiments where the display panel DP is an organic light emitting display panel will be described.

The input sensing unit ISP may be disposed on the display panel DP. The input sensing unit ISP may include a plurality of sensor units (not illustrated) for sensing an external input in a capacitive manner. The input sensing unit ISP may be directly manufactured on the display panel DP when the display device DD is manufactured. However, without being limited thereto, the input sensing unit ISP may be manufactured as a panel separate from the display panel DP and may be attached to the display panel DP by an adhesive layer.

The anti-reflection layer RPL may be disposed on the input sensing unit ISP. The anti-reflection layer RPL may be directly formed on the input sensing unit ISP, or may be coupled to the input sensing unit ISP by an adhesive layer. The anti-reflection layer RPL may be defined as a film for preventing reflection of external light. The anti-reflection layer RPL may decrease the reflectance of external light incident toward the display panel DP from above the display device DD.

When external light travelling toward the display panel DP is reflected from the display panel DP and provided back to the user, the user may visually recognize the external light as in a mirror. To prevent such a phenomenon, the anti-reflection layer RPL may include a plurality of color filters that display the same colors as those of pixels of the display panel DP.

The color filters may filter the external light into the same colors as those of the pixels, such that the external light may not be visible to the user. Alternatively, without being limited thereto, the anti-reflection layer RPL may include a polarizer film for decreasing the reflectance of the external light. The polarizer film may include a phase retarder and/or a polarizer.

The window WIN may be disposed on the anti-reflection layer RPL. The window WIN may be directly formed on the anti-reflection layer RPL, or may be coupled to the anti-reflection layer RPL by an adhesive layer. The window WIN may protect the display panel DP, the input sensing unit ISP, and the anti-reflection layer RPL from external scratches and shocks.

The panel protection film PF may be disposed under the display panel DP. The panel protection film PF may be directly formed on the bottom of the display panel DP, or may be coupled to the display panel DP by an adhesive layer. The panel protection film PF may protect the bottom of the display panel DP. The panel protection film PF may include a flexible plastic material such as polyethylene terephthalate (PET).

Figure 6:
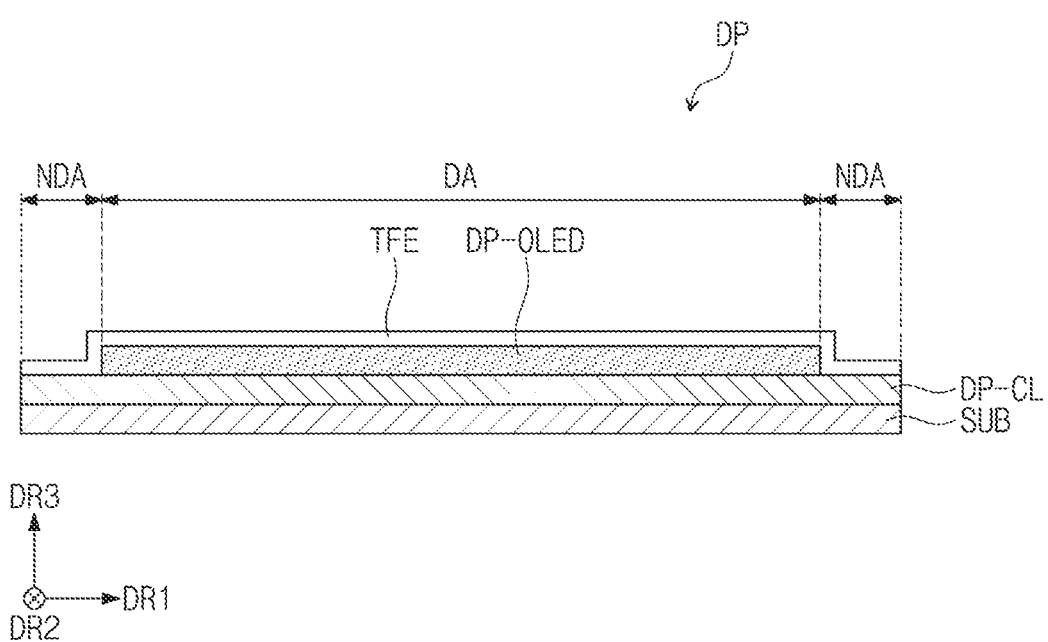
FIG. 6 is a sectional view of a display panel illustrated in FIG. 5.

FIG. 6 is a sectional view of the display panel illustrated in FIG. 5.

In FIG. 6, a section of the display panel DP viewed in the second direction DR2 is illustrated.

Referring to FIG. 6, an embodiment of the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display region DA and a non-display region NDA around the display region DA. The substrate SUB may include a flexible plastic material such as polyimide (PI). The display element layer DP-OLED may be disposed on the display region DA.

A plurality of pixels may be disposed in the display region DA. Each of the pixels may include a light emitting element that is connected to a transistor disposed in the circuit element layer DP-CL and is disposed in the display element layer DP-OLED.

The thin film encapsulation layer TFE may be disposed on the circuit element layer DP-CL to cover the display element layer DP-OLED. The thin film encapsulation layer TFE may include inorganic layers and an organic layer between the inorganic layers. The inorganic layers may protect the pixels from moisture/oxygen. The organic layer may protect the pixels PX from foreign matter such as dust particles.

Figure 7:
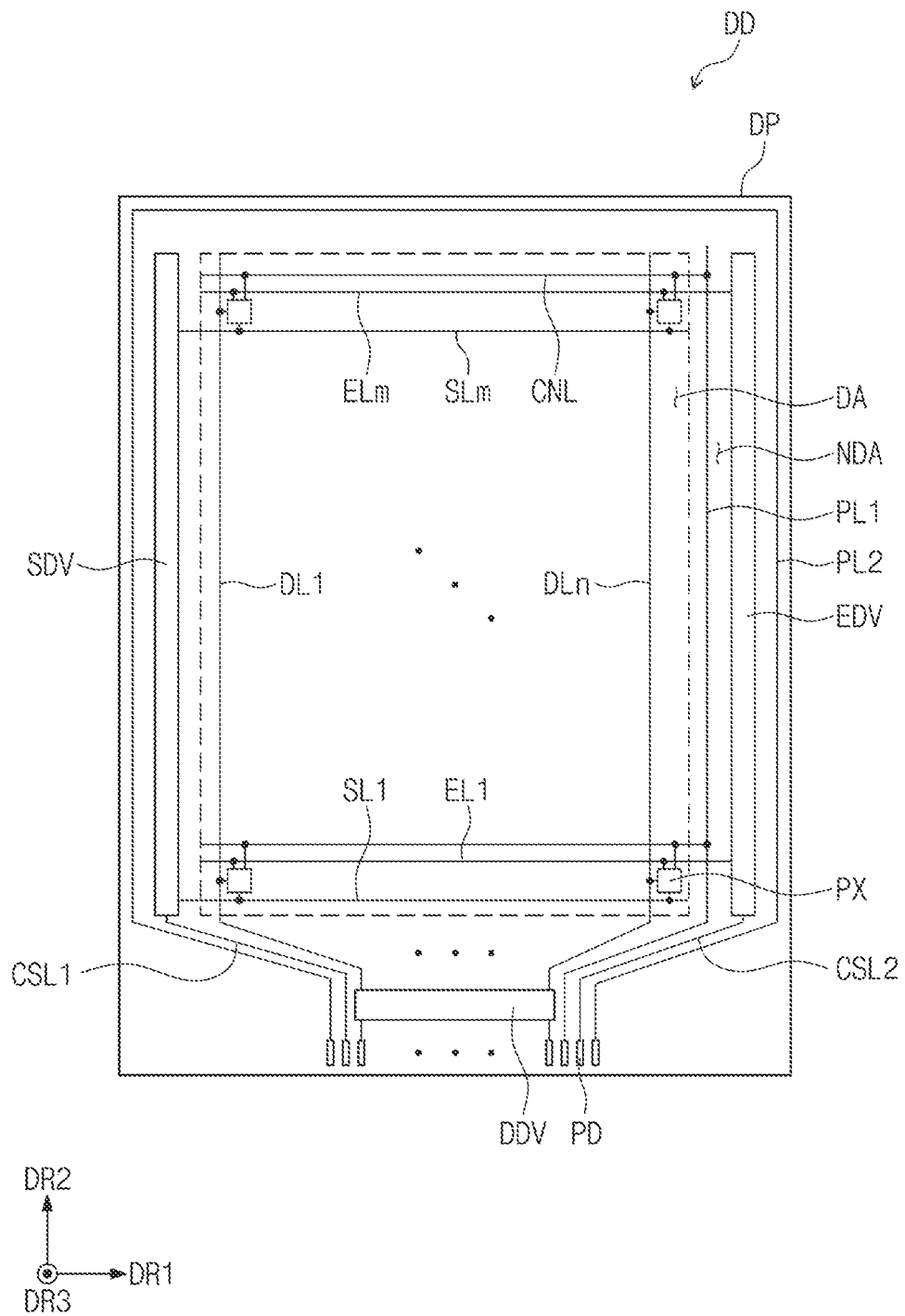
FIG. 7 is a plan view of the display panel illustrated in FIG. 6.

FIG. 7 is a plan view of the display panel illustrated in FIG. 6.

Referring to FIG. 7, an embodiment of the display device DD may include the display panel DP, a scan driver SDV, a data driver DDV, an emission driver EDV, and a plurality of pads PD.

The display panel DP may include a display region DA and a non-display region NDA surrounding the display region DA. The display panel DP may have a rectangular shape with long sides extending in the second direction DR2 and short sides extending in the first direction DR1. However, the shape of the display panel DP is not limited thereto.

The display panel DP may include the plurality of pixels PX, a plurality of scan lines SL1 to SLm, a plurality of data lines DL1 to DLn, a plurality of emission lines EL1 to ELm, first and second control lines CSL1 and CSL2, first and second power lines PL1 and PL2, and connecting lines CNL. Here, "m" and "n" are natural numbers.

The pixels PX may be disposed in the display region DA. The scan driver SDV and the emission driver EDV may be disposed in the non-display regions NDA adjacent to the long sides of the display panel DP, respectively. The data driver DDV may be disposed in the non-display region NDA adjacent to one of the short sides of the display panel DP. The data driver DDV may be adjacent to a lower end of the display panel DP when viewed from above the plane or in the third direction DR3. Here, the third direction DR3 may be a thickness direction of the display panel DP.

The scan lines SL1 to SLm may extend in the first direction DR1 and may be connected to the pixels PX and the scan driver SDV. The data lines DL1 to DLn may extend in the second direction DR2 and may be connected to the pixels PX and the data driver DDV. The emission lines EL1 to ELm may extend in the first direction DR1 and may be connected to the pixels PX and the emission driver EDV.

The first power line PL1 may extend in the second direction DR2 and may be disposed in the non-display region NDA. The first power line PL1 may be disposed between the display region DA and the emission driver EDV. Alternatively, without being limited thereto, the first power line PL1 may be disposed between the display region DA and the scan driver SDV.

The connecting lines CNL may extend in the first direction DR1 and may be arranged in the second direction DR2. The connecting lines CNL may be connected to the first power line PL1 and the pixels PX. A first voltage may be applied to the pixels PX through the first power line PL1 and the connecting lines CNL connected with each other.

The second power line PL2 may be disposed in the non-display region NDA. The second power line PL2 may extend along the long sides of the display panel DP and the other short side of the display panel DP where the data driver DDV is not disposed. The second power line PL2 may be disposed outward of the scan driver SDV and the emission driver EDV.

Although not illustrated, the second power line PL2 may extend toward the display region DA and may be connected to the pixels PX. A second voltage having a lower level than the first voltage may be applied to the pixels PX through the second power line PL2.

The first control line CSL1 may be connected to the scan driver SDV and may extend toward the lower end of the display panel DP when viewed from above the plane or in the third direction DR3. The second control line CSL2 may be connected to the emission driver EDV and may extend toward the lower end of the display panel DP when viewed from above the plane or in the third direction DR3. The data driver DDV may be disposed between the first control line CSL1 and the second control line CSL2.

The pads PD may be disposed on the display panel DP. The pads PD may be closer to the lower end of the display panel DP than the data driver DDV. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Although not illustrated, the display device DD may further include a timing controller for controlling operations of the scan driver SDV, the data driver DDV, and the emission driver EDV and a voltage generator for generating the first and second voltages. The timing controller and the voltage generator may be connected to corresponding pads PD through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The pixels PX may receive the data voltages in response to the scan signals. The pixels PX may display an image by emitting light having luminance corresponding to the data voltages in response to the emission signals. The light emission time of the pixels PX may be controlled by the emission signals.

Figure 8A:
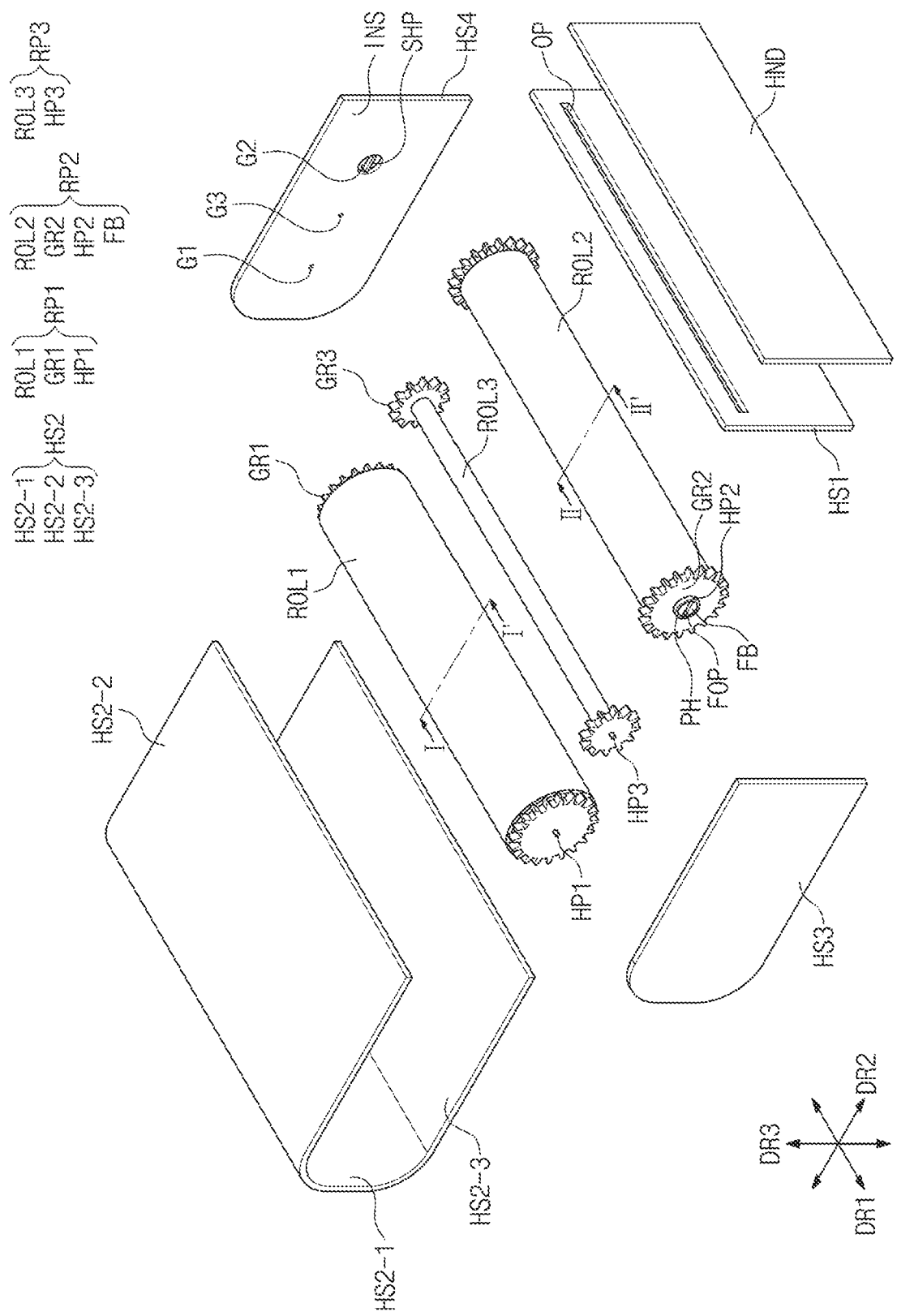
FIG. 8A is an exploded perspective view illustrating the housing of FIG. 1 and components in the housing.
Figure 8B:
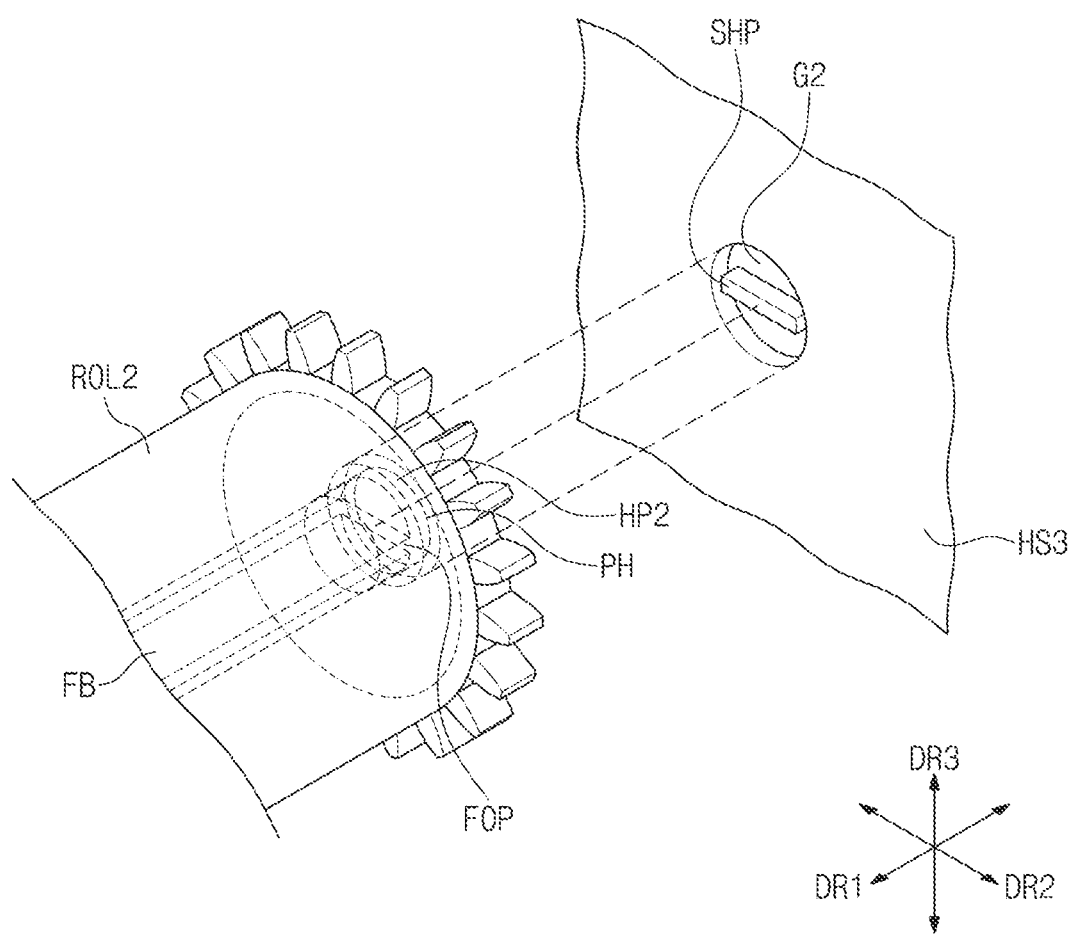
FIG. 8B is an enlarged perspective view of a second fastening recess illustrated in FIG. 8A.

FIG. 8A is an exploded perspective view illustrating the housing of FIG. 1 and components in the housing. FIG. 8B is an enlarged perspective view of a second fastening recess illustrated in FIG. 8A.

In FIGS. 8A and 8B, for convenience of illustration, the display module DM and the support parts SUP are omitted.

Referring to FIGS. 8A and 8B, in an embodiment, the housing HS may include a first housing HS1, a second housing HS2, a third housing HS3, and a fourth housing HS4. The first housing HS1 and the second housing HS2 may face (or be opposite to) each other in the second direction DR2. The third housing HS3 and the fourth housing HS4 may face each other in the first direction DR1.

The first housing HS1 may be on a plane defined by the first and third directions DR1 and DR3. The first housing HS1 may extend longer in the first direction DR1 than in the third direction DR3. The opening OP may be defined in the first housing HS1. The opening OP may extend in the first direction DR1 and may be adjacent to an upper end of the first housing HS1.

The second housing HS2 may include a first second housing (hereinafter, will be referred to as "housing 2-1") HS2-1, a second housing (hereinafter, will be referred to as "housing 2-2") HS2-2 extending from an upper portion of the housing 2-1 HS2-1, and a third second housing (hereinafter, will be referred to as "housing 2-3") HS2-3 extending from a lower portion of the housing 2-1 HS2-1.

The housing 2-1 HS2-1 may face the first housing HS1 in the second direction DR2 and may be on a plane defined by the first and third directions DR1 and DR3. The housing 2-1 HS2-1 may extend longer in the first direction DR1 than in the third direction DR3.

The housing 2-2 HS2-2 and the housing 2-3 HS2-3 may face each other in the third direction DR3. The housing 2-2 HS2-2 and the housing 2-3 HS2-3 may be on a plane defined by the first and second directions DR1 and DR2. The housing 2-2 HS2-2 and the housing 2-3 HS2-3 may extend longer in the first direction DR1 than in the second direction DR2.

The third housing HS3 and the fourth housing HS4 may face each other in the first direction DR1. The third housing HS3 and the fourth housing HS4 may be on a plane defined by the second and third directions DR2 and DR3. The third housing HS3 and the fourth housing HS4 may extend longer in the second direction DR2 than in the third direction DR3.

A plurality of fastening recesses G1, G2, and G3 may be defined on inner surfaces INS of the third housing HS3 and the fourth housing HS4. The fastening recesses G1, G2, and G3 may include the first fastening recesses G1, the second fastening recesses G2, and the third fastening recesses G3. The first and second fastening recesses G1 and G2 may be arranged in the second direction DR2. The first fastening recesses G1 may be adjacent to the housing 2-1 HS2-1. The second fastening recesses G2 may be adjacent to the first housing HS1. The third fastening recesses G3 may be defined between the first and second fastening recesses G1 and G2.

Side protrusions SHP may be disposed in the second fastening recesses G2. The second fastening recesses G2 may surround the side protrusions SHP. The side protrusions SHP may have a rectangular shape when viewed in the first direction DR1.

The first housing HS1 may be connected to one side of both sides of the third and fourth housings HS3 and HS4 opposite to each other in the second direction DR2. The first housing HS1 may be connected to an end of the housing 2-2 HS2-2 and an end of the housing 2-3 HS2-3.

The second housing HS2 may be connected to other side of the third and fourth housings HS3 and HS4 opposite to each other in the second direction DR2, upper ends of the third and fourth housings HS3 and HS4, and lower ends of the third and fourth housings HS3 and HS4. In an embodiment, the housing 2-1 HS2-1 may be connected to the other side of the third and fourth housings HS3 and HS4 opposite to each other in the second direction DR2. The housing 2-2 HS2-2 may be connected to the upper ends of the third and fourth housings HS3 and HS4. The housing 2-3 HS2-3 may be connected to the lower ends of the third and fourth housings HS3 and HS4.

Although the boundaries between the first to fourth housings HS1 to HS4 of the housing HS are not illustrated in FIG. 1, the housing HS illustrated in FIG. 1 may be divided into the first to fourth housings HS1 to HS4 as illustrated in FIG. 8A.

The handle HND may be adjacent to the first housing HS1. The handle HND may be disposed on one side surface of the first housing HS1 that does not face the second housing HS2.

The display device DD may include a first roller part RP1, a second roller part RP2, and a third roller part RP3.

The first roller part RP1 and the second roller part RP2 may be arranged in the second direction DR2. The second roller part RP2 may be spaced apart from the first roller part RP1 in the second direction DR2. The third roller part RP3 may be disposed between the first roller part RP1 and the second roller part RP2.

The first roller part RP1 may include a first roller ROL1, a plurality of first gears GR1, and a plurality of first protrusions HP1. The first roller ROL1 may extend in the first direction DR1. The first roller ROL1 may have a cylindrical shape.

The first gears GR1 may be disposed adjacent to opposite sides of the first roller ROL1 that are opposite to each other or face away from each other in the first direction DR1. The first gears GR1 may be disposed on the outside (or an outer surface) of the first roller ROL1.

The first protrusions HP1 may extend from the first gears GR1 in the first direction DR1. In an embodiment, the first protrusions HP1 and the first gears GR1 may be integrally formed with each other as a single unitary and indivisible part. The first protrusions HP1 may have a cylindrical shape. The first protrusions HP1 may have a circular shape when viewed in the first direction DR1.

Each of the first protrusions HP1 may be rotatably inserted into a corresponding one of the first fastening recesses G1 defined on the inner surfaces INS of the third and fourth housings HS3 and HS4. Accordingly, the first roller part RP1 may be rotated (or rotatably connected) between the third and fourth housings HS3 and HS4.

The second roller part RP2 may include a second roller ROL2, a plurality of second gears GR2, a fixed bar FB, and a plurality of second protrusions HP2. The second roller ROL2 may extend in the first direction DR1. The second roller ROL2 may have a cylindrical shape.

The second gears GR2 may be disposed on opposite sides of the second roller ROL2 that face away from each other in the first direction DR1. The second gears GR2 may be disposed on the outside of the second roller ROL2.

The second protrusions HP2 may extend from the second gears GR2 in the first direction DR1. In an embodiment, the second protrusions HP2 and the second gears GR2 may be integrally formed with each other as a single unitary and indivisible part. Through-holes PH may be defined in the second protrusions HP2, respectively. In an embodiment, the fixed bar FB may be dispose in the through-holes PH, and opposite sides of the fixed bar FB that face away from each other in the first direction DR1 may be exposed from the second protrusions HP2 to the outside through the through-holes PH. A fixed opening FOP may be defined in the fixed bar FB. The fixed opening FOP may have a rectangular shape when viewed in the first direction DR1. The fixed bar FB will be described below in detail with reference to FIG. 11.

The side protrusions SHP may be disposed in the fixed opening FOP. Since each of the second protrusions HP2 is inserted into a corresponding one of the second fastening recesses G2, the fixed bar FB may be fixed to the third and fourth housings HS3 and HS4 without being rotated.

The second protrusions HP2 may be disposed in the second fastening recesses G2. The second protrusions HP2 may be coupled to the second fastening recesses G2 to be rotatable. Accordingly, the second gears GR2 and the second roller ROL2 may be rotated between the third and fourth housings HS3 and HS4.

The third roller part RP3 may include a third roller ROL3, a plurality of third gears GR3, and a plurality of third protrusions HP3. The third roller ROL3 may extend in the first direction DR1. The third roller ROL3 may have a cylindrical shape.

The third gears GR3 may be disposed on opposite sides of the third roller ROL3 that face away from each other in the first direction DR1. The third gears GR3 may be disposed on the outside of the third roller ROL3. In an embodiment, the third roller ROL3 and the third gears GR3 may be integrally formed with each other as a single unitary and indivisible part.

The third protrusions HP3 may extend from the third gears GR3 in the first direction DR1. In an embodiment, the third protrusions HP3 and the third gears GR3 may be integrally formed with each other as a single unitary and indivisible part.

Each of the third protrusions HP3 may be rotatably inserted into a corresponding one of the third fastening recesses G3 defined on the third and fourth housings HS3 and HS4. Accordingly, the third roller part RP3 may be rotated between the third and fourth housings HS3 and HS4.

Figure 9:
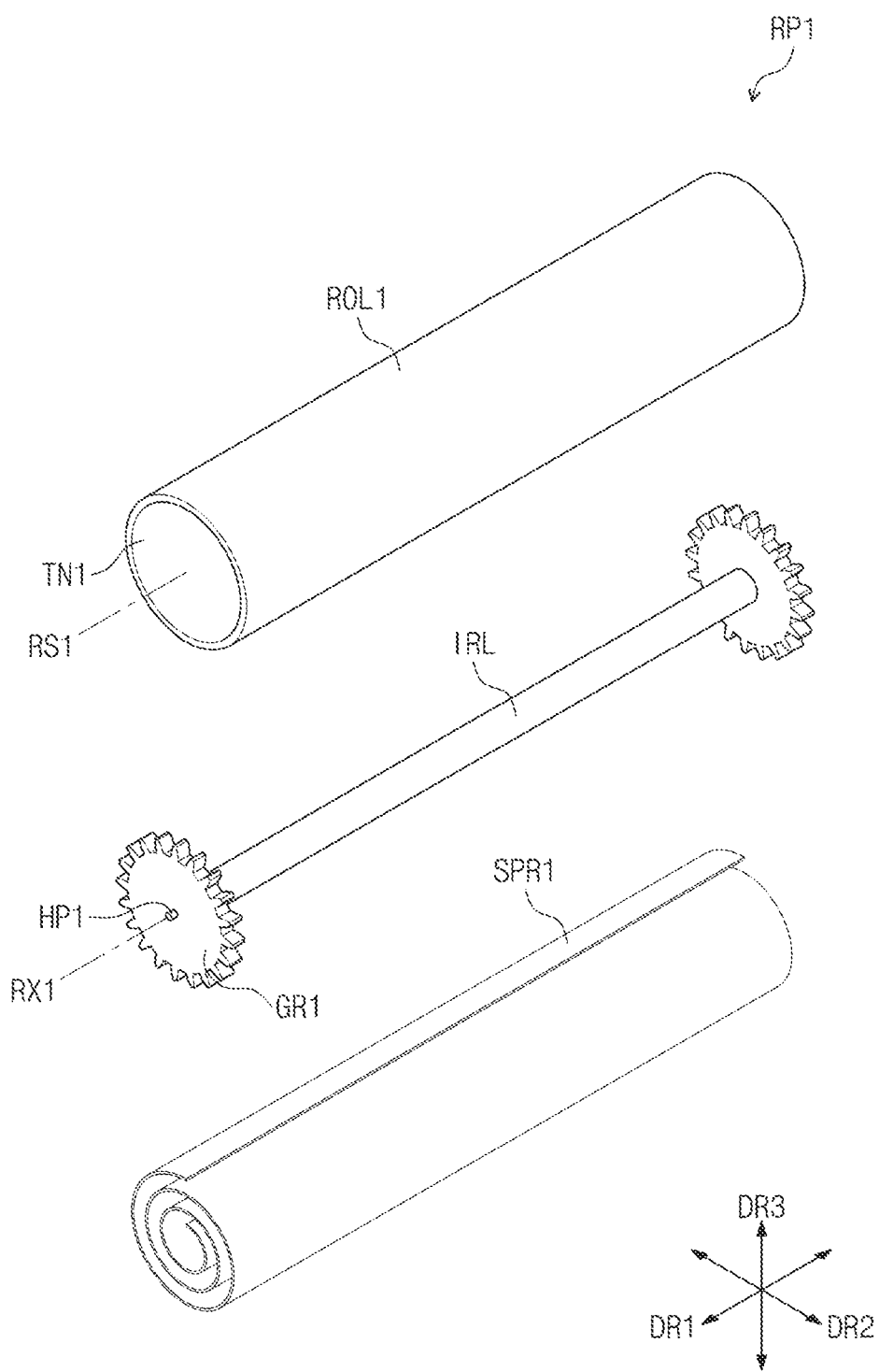
FIG. 9 is an exploded perspective view of a first roller part illustrated in FIG. 8A.
Figure 10:
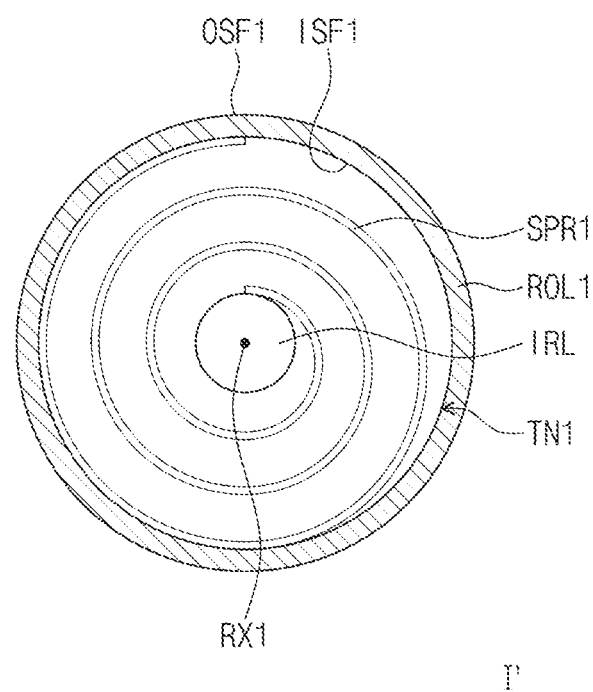
FIG. 10 is a sectional view of the first roller part illustrated in FIG. 8A.
Figure 10:
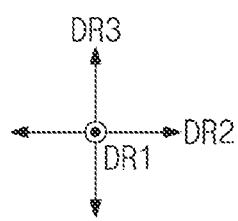

FIG. 9 is an exploded perspective view of the first roller part illustrated in FIG. 8A. FIG. 10 is a sectional view of the first roller part illustrated in FIG. 8A.

Particularly, FIG. 10 is a sectional view taken along line I-I' illustrated in FIG. 8A.

The first roller ROL1, the first gears GR1, and the first protrusions HP1 of FIGS. 9 and 10 are substantially the same as the first roller ROL1, the first gears GR1, and the first protrusions HP1 of FIG. 8A, and therefore any repetitive detailed descriptions thereof will be omitted.

Referring to FIGS. 9 and 10, in an embodiment, a first tunnel TN1 may be defined in the first roller ROL1. The first tunnel TN1 may extend in the first direction DR1. The first tunnel TN1 may have a circular shape when viewed in the first direction DR1.

The first roller part RP1 may further include an inner roller IRL and a first elastic body SPR1. The inner roller IRL may extend in the first direction DR1. The inner roller IRL may have a cylindrical shape. The inner roller IRL may be connected to the first gears GR1. The first gears GR1 may be connected to opposite sides of the inner roller IRL that face away from each other in the first direction DR1.

The first elastic body SPR1 may be wound in the counterclockwise direction around a first rotational axis RX1 parallel to the first direction DR1. In an embodiment, for example, the first elastic body SPR1 may be a spiral spring. Alternatively, without being limited thereto, the first elastic body SPR1 may be a torsion spring. The type of the first elastic body SPR1 will be described in detail with reference to FIGS. 17A and 17B.

The inner roller IRL and the first elastic body SPR1 may be disposed in the first tunnel TN1. In the first tunnel TN1, the first elastic body SPR1 may be disposed between the inner roller IRL and a first inner circumferential surface ISF1 of the first roller ROL1.

The first elastic body SPR1 may be connected to the first roller ROL1 and the inner roller IRL. In an embodiment, one end of the first elastic body SPR1 may be connected to an outer surface of the inner roller IRL. The other end of the first elastic body SPR1 may be connected to the first inner circumferential surface ISF1 of the first roller ROL1.

A portion of the first elastic body SPR1 that extends from the inner roller IRL may extend toward the first inner circumferential surface ISF1 to be disposed adjacent to the first inner circumferential surface ISF1 and may surround the inner roller IRL.

The first roller ROL1 and the inner roller IRL may rotate about the first rotational axis RX1 parallel to the first direction DR1. The first elastic body SPR1 may generate an elastic force in a predetermined direction. The first elastic body SPR1 may provide the elastic force to the first roller ROL1 such that the first roller ROL1 rotates in the counterclockwise direction. However, this is illustrative, and depending on the connection location of the first elastic body SPR1, the first elastic body SPR1 may provide the elastic force to the first roller ROL1 such that the first roller ROL1 rotates in the clockwise direction. This operation will be described below in detail with reference to FIG. 16C.

Figure 11:
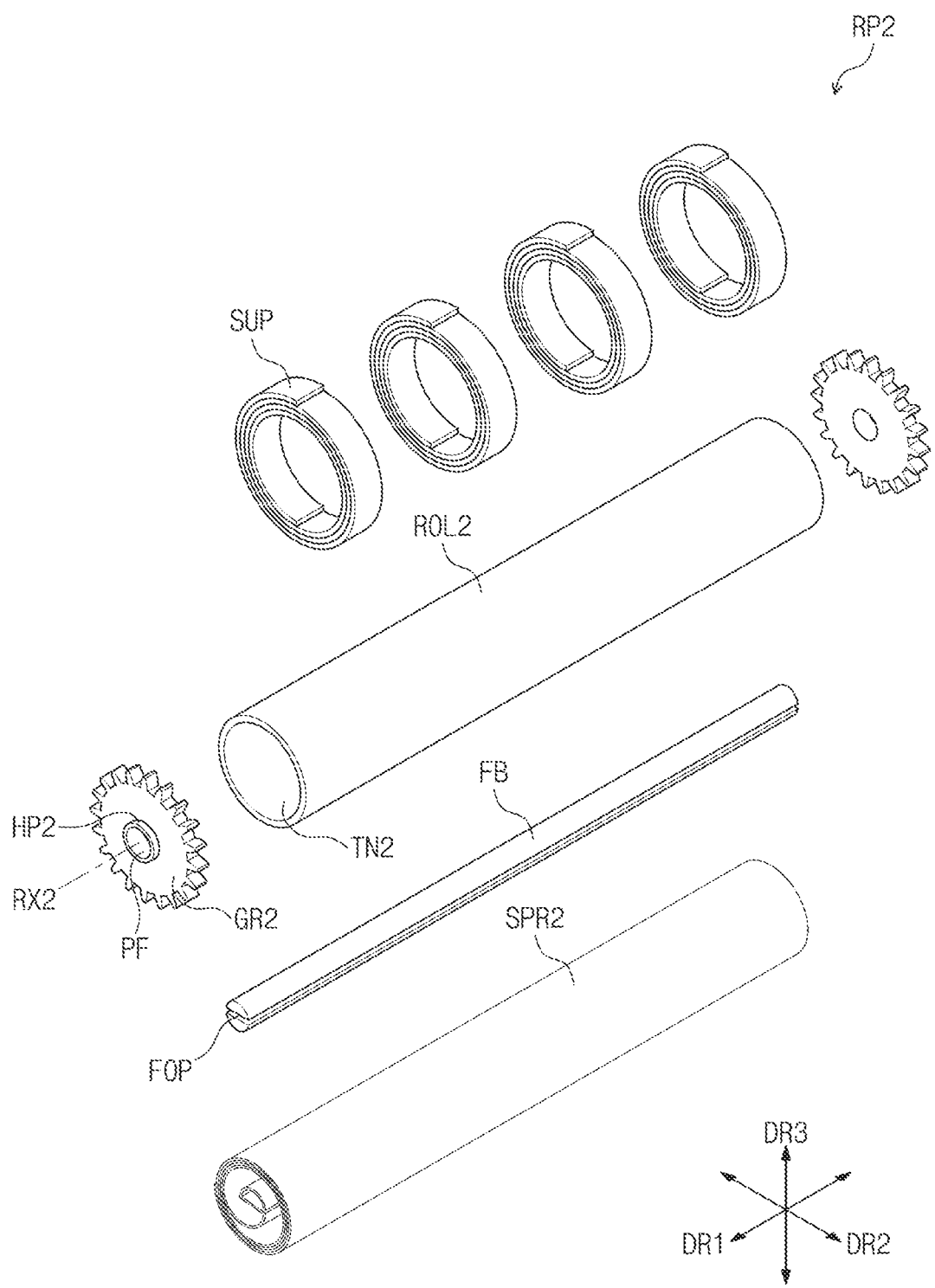
FIG. 11 is an exploded perspective view of a second roller part illustrated in FIG. 8A.
Figure 12:
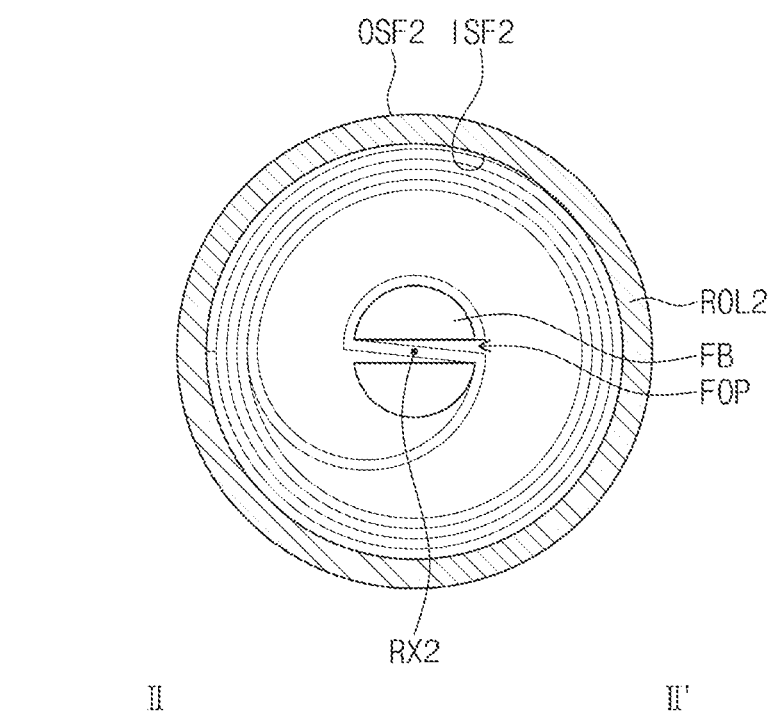
FIG. 12 is a sectional view of the second roller part illustrated in FIG. 11.
Figure 12:
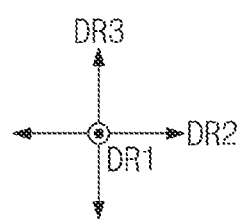
Figure 13A:
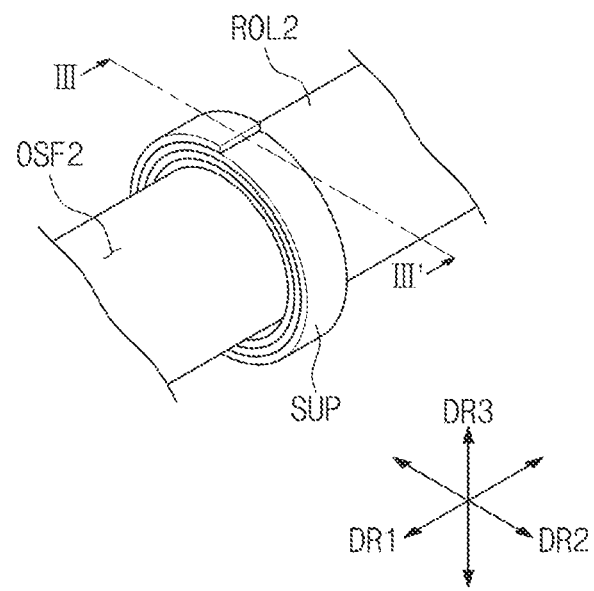
FIGS. 13A and 13B are views illustrating support parts illustrated in FIG. 11.
Figure 13B:
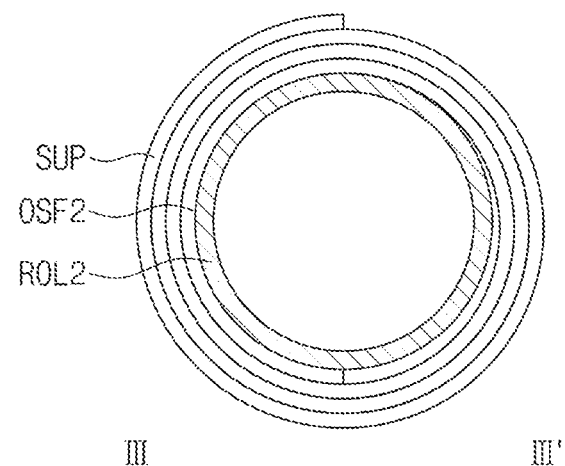
Figure 13B:
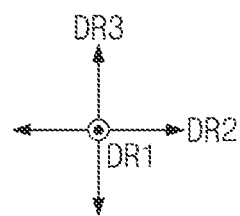
Figure 14A:
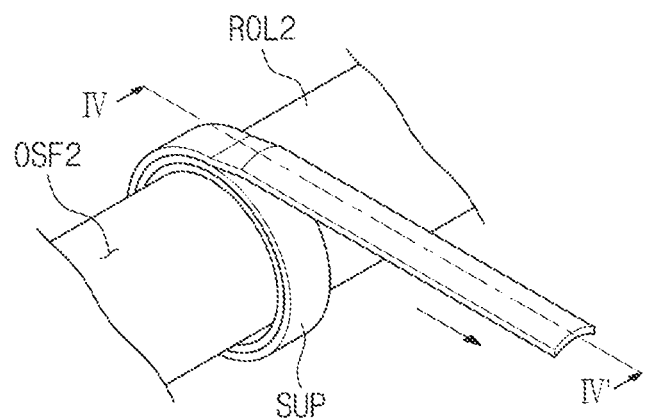
FIGS. 14A and 14B are views illustrating the support parts illustrated in FIG. 11.
Figure 14B:
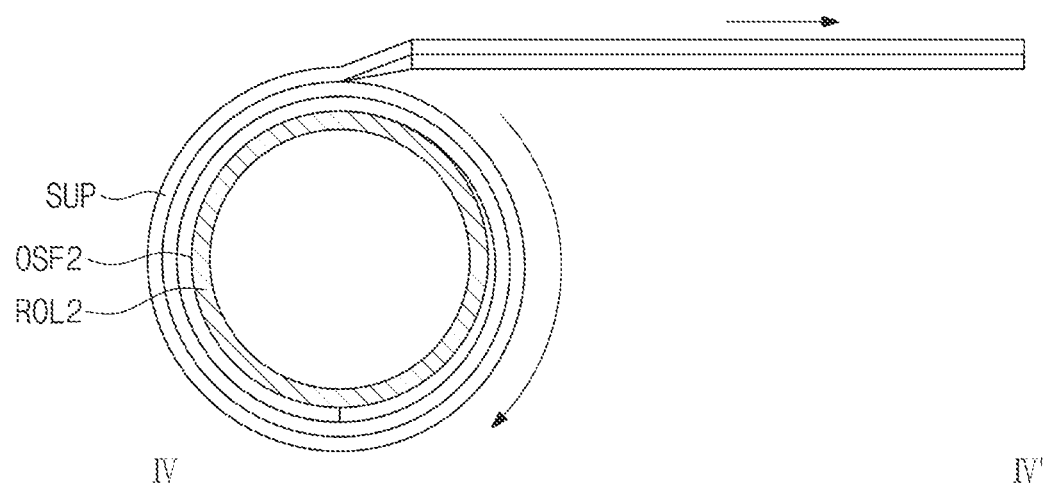
Figure 14B:
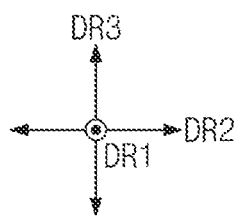

FIG. 11 is an exploded perspective view of the second roller part illustrated in FIG. 8A. FIG. 12 is a sectional view of the second roller part illustrated in FIG. 11. FIGS. 13A and 13B are views illustrating the support parts illustrated in FIG. 11. FIGS. 14A and 14B are views illustrating the support parts illustrated in FIG. 11.

Particularly, FIG. 12 is a sectional view taken along line II-II' of FIG. 8A.

Particularly, the support parts SUP illustrated in FIGS. 13A and 13B are in a wound state.

Particularly, the support parts SUP illustrated in FIGS. 14A and 14B are in an unwound state.

Particularly, FIG. 13B is a sectional view taken along line III-III' illustrated in FIG. 13A.

Particularly, FIG. 14B is a sectional view taken along line IV-IV illustrated in FIG. 14A.

For convenience of illustration and description, the fixed bar FB and a second elastic body SPR2 are omitted in FIGS. 13A to 14B.

The second roller ROL2, the second gears GR2, and the second protrusions HP2 of FIGS. 11 and 12 are substantially the same the second roller ROL2, the second gears GR2, and the second protrusions HP2 of FIG. 8A, and therefore, any repetitive detailed descriptions thereof will be omitted.

Referring to FIGS. 11 and 12, in an embodiment, a second tunnel TN2 may be defined in the second roller ROL2. The second tunnel TN2 may extend in the first direction DR1. The second tunnel TN2 may have a circular shape when viewed in the first direction DR1.

The second roller part RP2 may further include the fixed bar FB, the second elastic body SPR2, and the support parts SUP. The fixed bar FB may have a cylindrical shape extending in the first direction DR1. The fixed opening FOP may be defined in the fixed bar FB through the fixed bar FB in the second direction DR2.

The second elastic body SPR2 may be wound in the clockwise direction around a second rotational axis RX2 parallel to the first direction DR1. In an embodiment, for example, the second elastic body SPR2 may be a spiral spring. Alternatively, without being limited thereto, the second elastic body SPR2 may be a torsion spring.

The fixed bar FB and the second elastic body SPR2 may be disposed in the second tunnel TN2. The second elastic body SPR2 may be disposed between the fixed bar FB and the second roller ROL2 and may surround the fixed bar FB. The second elastic body SPR2 may surround the fixed bar FB at least once in the clockwise direction.

The second elastic body SPR2 may be connected to the fixed bar FB and the second roller ROL2. One end of the second elastic body SPR2 may pass through the fixed opening FOP defined in the fixed bar FB and may be connected to an outer surface of the fixed bar FB. The one end of the second elastic body SPR2 may be connected to a portion of the fixed bar FB that is disposed over the fixed opening FOP. The other end of the second elastic body SPR2 may be connected to a second inner circumferential surface ISF2 of the second roller ROL2.

A portion of the second elastic body SPR2 that extends from the fixed bar FB may extend toward the second inner circumferential surface ISF2 to be disposed adjacent to the second inner circumferential surface ISF2 and may surround the fixed bar FB.

The second roller ROL2 may rotate about the second rotational axis RX2 parallel to the first direction DR1. The fixed bar FB may not rotate about the second rotational axis RX2.

Referring to FIGS. 2, 11, 13A, and 13B, the plurality of support parts SUP may be provided. The support parts SUP may be connected to a second outer circumferential surface OSF2 of the second roller ROL2. The support parts SUP may be wound around the second roller ROL2 in the clockwise direction. One ends of the support parts SUP may be connected to the second outer circumferential surface OSF2 of the second roller ROL2.

Referring to FIGS. 2, 11, 14A, and 14B, the support parts SUP may be unwound. When the support parts SUP are unwound, the shape of the support parts SUP viewed in the second direction may be changed into a shape convexly curved upward. In an embodiment, for example, the support parts SUP extending in the second direction DR2 may have a shape symmetrical in the third direction DR3 to the shape of a tape measure extending from a case to the outside.

Figure 15A:
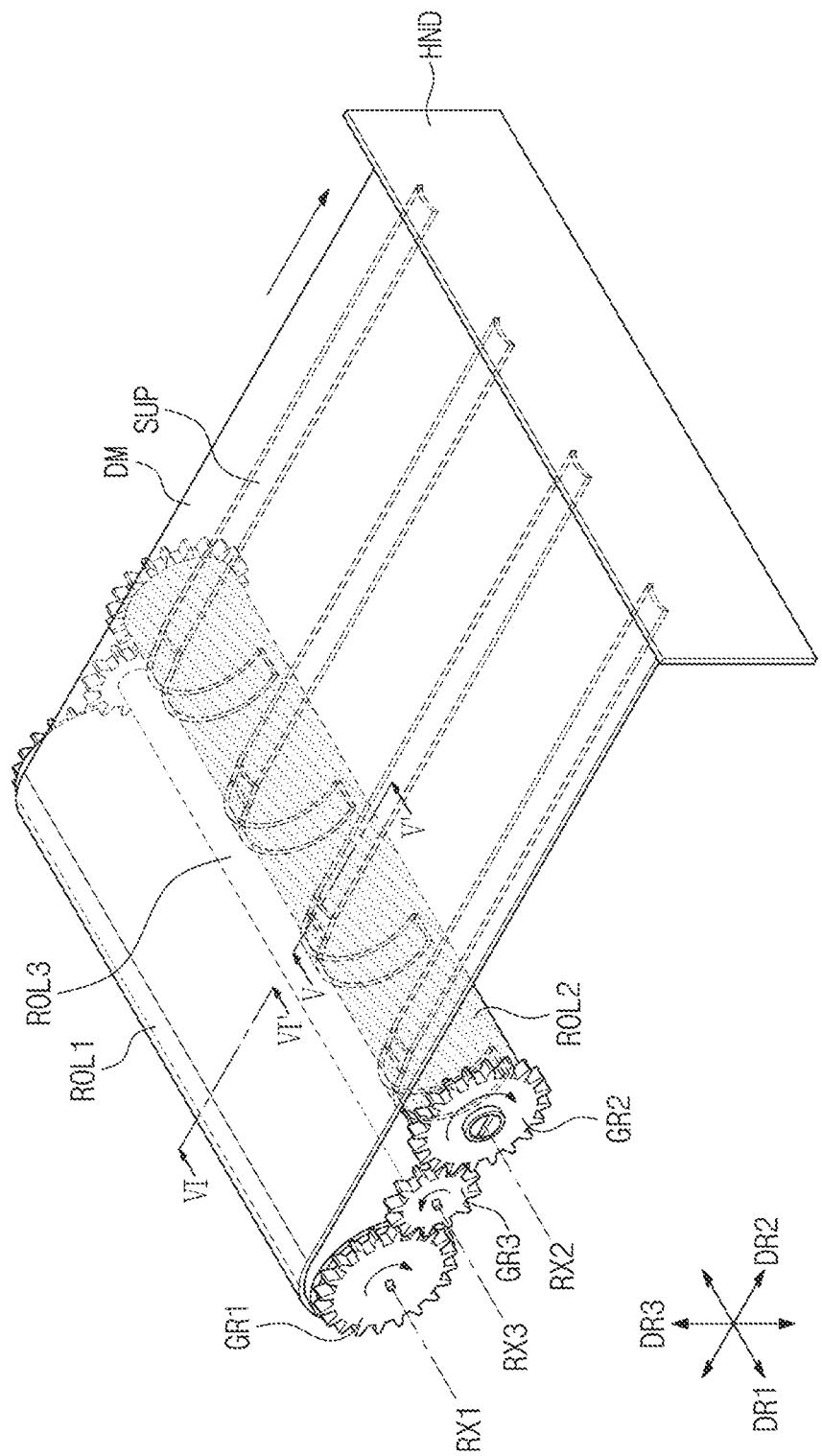
FIGS. 15A to 15C are views illustrating an unwinding operation of the display module and the support parts.
Figure 15B:
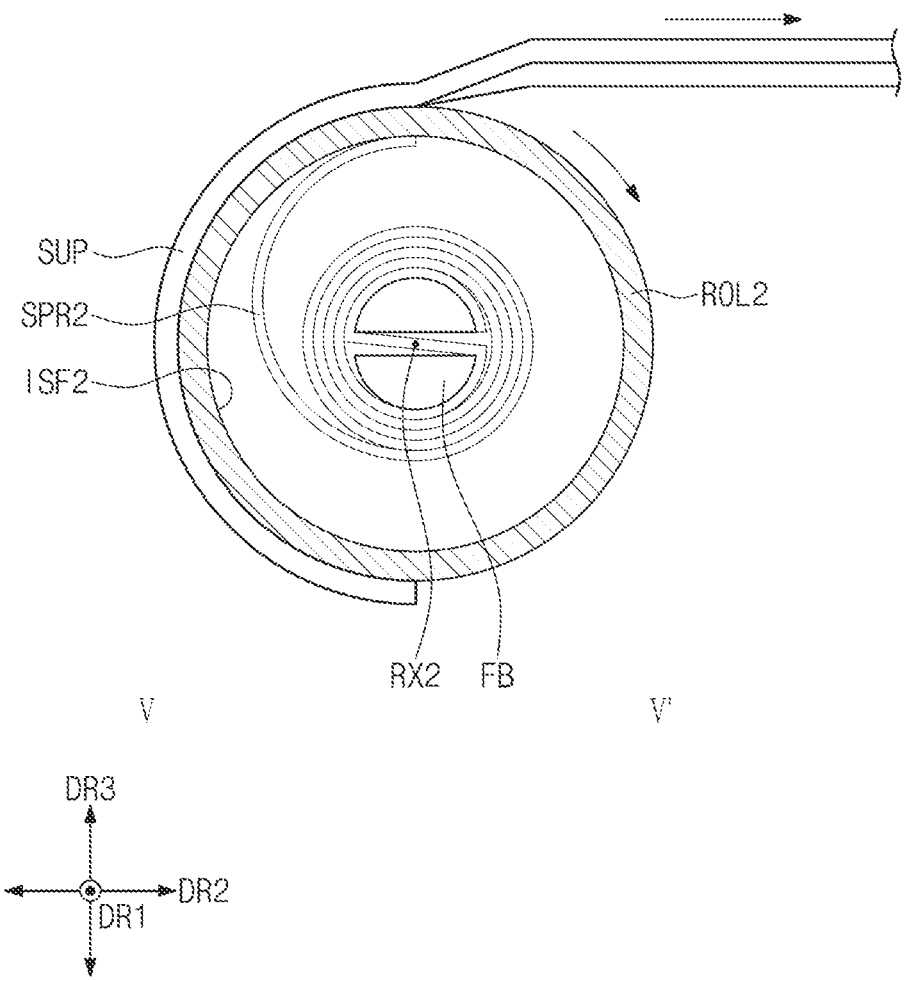
Figure 15C:
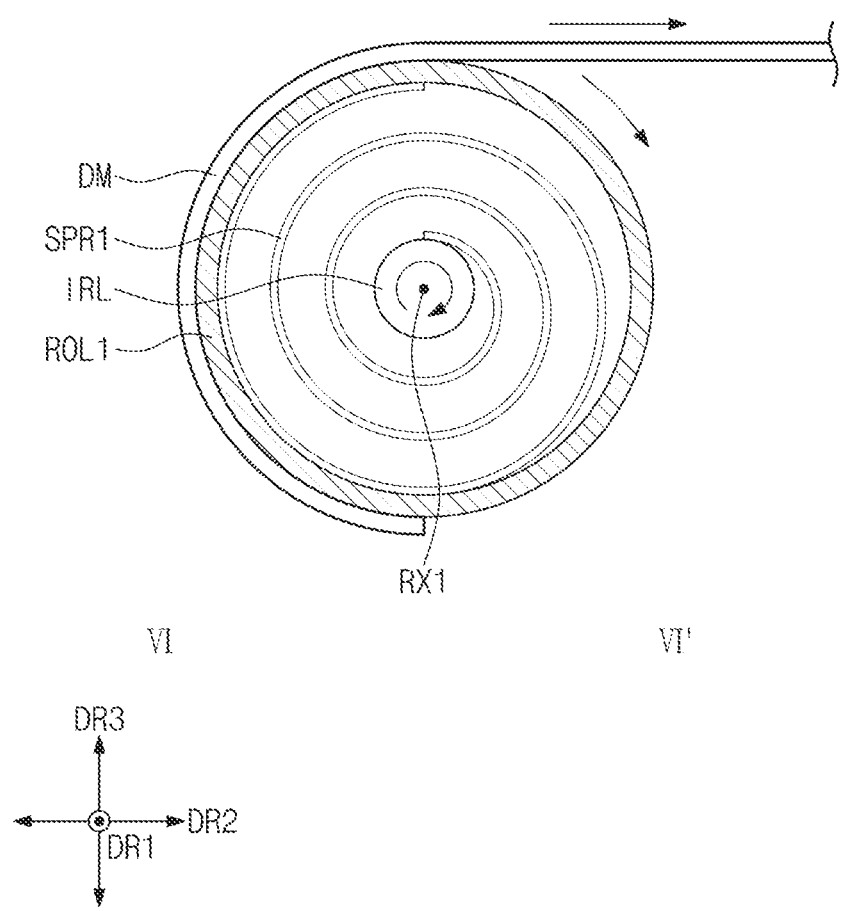

FIGS. 15A to 15C are views illustrating an unwinding operation of the display module and the support parts.

For convenience of illustration and description, the housing HS of FIG. 2 is omitted in FIGS. 15A to 15C.

Particularly, FIG. 15B is a sectional view taken along line V-V" illustrated in FIG. 15A, and FIG. 15C is a sectional view taken along line VI-VI' illustrated in FIG. 15A.

The first, second, and third rollers ROL1, ROL2, and ROL3, the first, second, and third gears GR1, GR2, and GR3, the display module DM, the support parts SUP, and the handle HND of FIGS. 15A to 15C are substantially the same as the first, second, and third rollers ROL1, ROL2, and ROL3, the first, second, and third gears GR1, GR2, and GR3, the display module DM, the support parts SUP, and the handle HND of FIGS. 10 to 14B and therefore, any repetitive detailed description thereof will be omitted or simplified.

Referring to FIG. 15A, in an embodiment, the other ends of the display module DM and the support parts SUP may be connected to the handle HND. When the user holds and moves the handle HND in the second direction DR2, the display module DM connected to and wound around the first roller ROL1 may be unwound from the first roller ROL1. The support parts SUP connected to and wound around the second roller ROL2 may be unwound from the second roller ROL2.

When the support parts SUP are unwound, the shape of the support parts SUP viewed in the second direction DR2 may be changed into a shape convexly curved upward, that is, an unwound portion of the support parts SUP may be in a shape convexly curved upward when viewed in the second direction DR2. When the unwound portion of the support parts SUP have such a shape convexly curved upward, the support parts SUP may remain extending in the second direction DR2 without being curved downward with respect to the second direction DR2 (e.g., in the direction of a dotted arrow of FIG. 15A). Accordingly, the unwound portion of the support parts SUP may more effectively support the display module DM.

In the state in which the display module DM is unwound, the support parts SUP may support the unwound display module DM. The support parts SUP may effectively maintain the unwound display module DM to be in a flat state such that the display module DM may not sag downward.

When the display module DM and the support parts SUP are unwound, the first and second rollers ROL1 and ROL2 connected to the display module DM and the support parts SUP may be rotated in the clockwise direction.

Referring to FIGS. 15A and 15B, when the second roller ROL rotates, the second elastic body SPR2 connected to the second inner circumferential surface ISF2 of the second roller ROL2 may move adjacent to the fixed bar FB. When the support parts SUP are unwound from the second roller ROL2, the second elastic body SPR2 may have a shape wound around the fixed bar FB to be adjacent to the fixed bar FB.

When the second roller ROL2 rotates about the second rotational axis RX2 in the clockwise direction, the fixed bar FB may not rotate about the second rotational axis RX2.

Referring to FIGS. 15A and 15C, when the second roller ROL2 rotates, the second gears GR2 connected to the opposite sides of the second roller ROL2 that face away from each other in the first direction DR1 may be rotated. The second gears GR2 may be rotated about the second rotational axis RX2 in the clockwise direction.

When the second gears GR2 are rotated, the third gears GR3 engaged with the second gears GR2 may be rotated. The third gears GR3 may be rotated about a third rotational axis RX3 in the counterclockwise direction.

When the third gears GR3 are rotated, the first gears GR1 engaged with the third gears GR3 may be rotated. The first gears GR1 may be rotated about the first rotational axis RX1 in the clockwise direction. Accordingly, the inner roller IRL connected to the first gears GR1 may be rotated about the first rotational axis RX1 in the clockwise direction. The first gears GR1 and the second gears GR2 may be rotated in a same direction as each other. The third gears GR3 may be rotated in the direction opposite to the rotating direction of the first and second gears GR1 and GR2.

The first roller ROL1 and the inner roller IRL may be rotated about the first rotational axis RX1 in a same direction as each other. Accordingly, a difference in speed of rotation, e.g., revolutions per minute (RPM), between the first roller ROL1 and the inner roller IRL may be reduced. In such an embodiment, as the difference in speed of rotation between the first roller ROL1 and the inner roller IRL is reduced, the elastic force of the first elastic body SPR1 may remain constant when the display module DM is unwound.

Figure 16A:
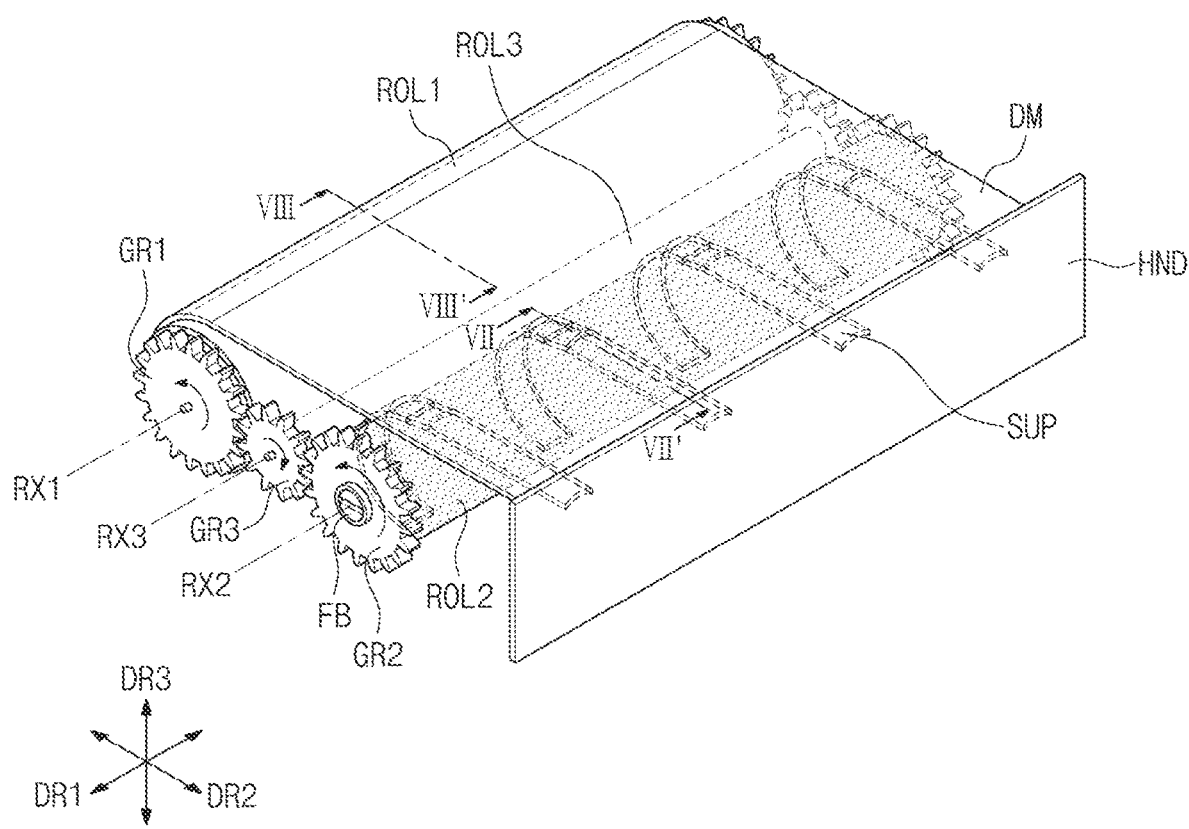
FIGS. 16A to 16C are views illustrating a winding operation of the display module and the support parts.
Figure 16B:
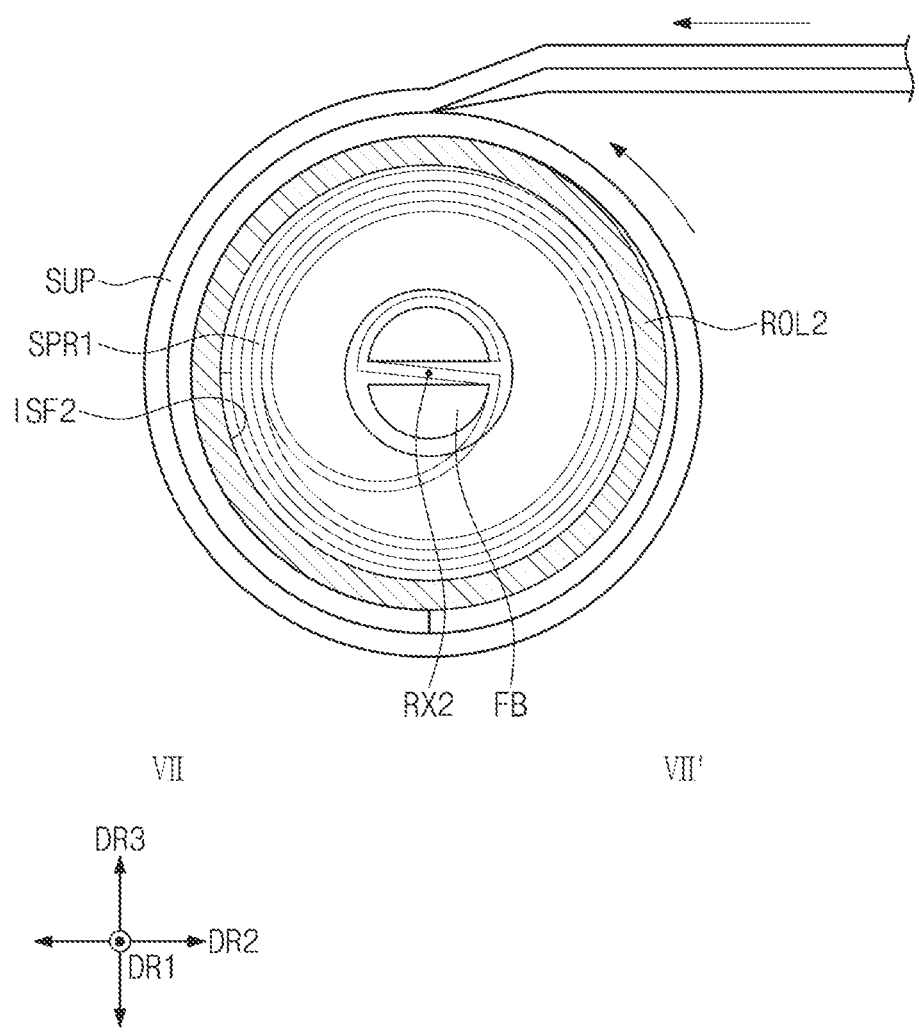
Figure 16C:
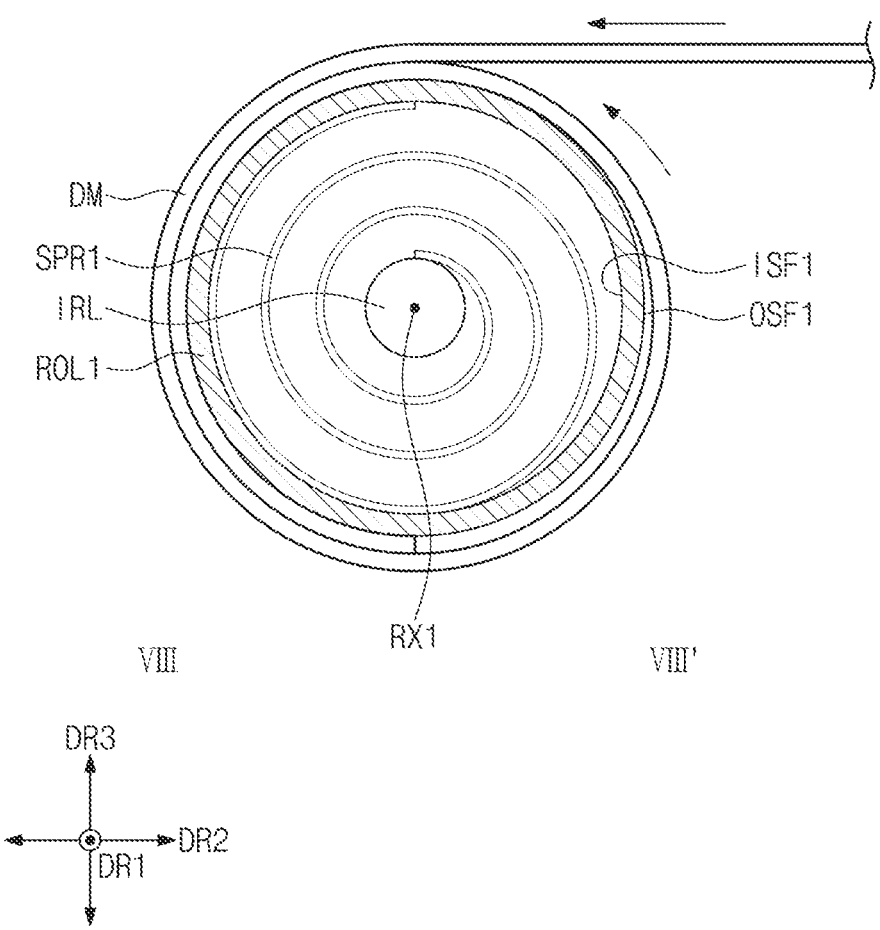

FIGS. 16A to 16C are views illustrating a winding operation of the display module and the support parts.

For convenience of description, the housing HS of FIG. 2 is omitted in FIGS. 16A to 16C.

For example, FIG. 16B is a sectional view taken along line VII-VII' illustrated in FIG. 16A, and FIG. 16C is a sectional view taken along line VIII-VIII' illustrated in FIG. 16A.

The first, second, and third rollers ROL1, ROL2, and ROL3, the first, second, and third gears GR1, GR2, and GR3, the display module DM, the support parts SUP, and the handle HND of FIGS. 16A to 16C are substantially the same as the first, second, and third rollers ROL1, ROL2, and ROL3, the first, second, and third gears GR1, GR2, and GR3, the display module DM, the support parts SUP, and the handle HND of FIGS. 10 to 14B and therefore, any repetitive detailed description thereof will be omitted or simplified.

Referring to FIGS. 16A and 16B, the display module DM may move in the second direction DR2 and may be wound around the first roller ROL1. The support parts SUP may move in the second direction DR2 and may be wound around the second roller ROL2.

When the support parts SUP are wound, the second roller ROL2 connected to the other ends of the support parts SUP may be rotated about the second rotational axis RX2 in the counterclockwise direction. The other end of the second elastic body SPR2 connected to the second roller ROL2 may rotate. The fixed bar FB connected to the one end of the second elastic body SPR2 may not rotate about the second rotational axis RX2.

When the support parts SUP are wound, the second elastic body SPR2 may move adjacent to the second inner circumferential surface ISF2. When the second elastic body SPR2 moves to the second inner circumferential surface ISF2, the second elastic body SPR2 may provide an elastic force such that the second roller ROL2 rotates in the counterclockwise direction.

Referring to FIGS. 16A and 16C, when the display module DM is wound, the first roller ROL1 connected to the other end of the display module DM may be rotated about the first rotational axis RX1 in the counterclockwise direction.

Referring to FIGS. 16A to 16C, when the second roller ROL2 rotates about the second rotational axis RX2 in the counterclockwise direction, the second gears GR2 connected to the second roller ROL2 may be rotated about the second rotational axis RX2 in the counterclockwise direction.

When the second gears GR2 rotate about the second rotational axis RX2 in the counterclockwise direction, the third gears GR3 engaged with the second gears GR2 may be rotated about the third rotational axis RX3 in the clockwise direction. The third roller ROL3 connected to the third gears GR3 may be rotated about the third rotational axis RX3 in the clockwise direction.

When the third gears GR3 rotate about the third rotational axis RX3, the first gears GR1 engaged with the third gears GR3 may be rotated about the first rotational axis RX1 in the counterclockwise direction. The third gears GR3 may be rotated in the direction opposite to the rotating direction of the first and second gears GR1 and GR2.

When the first gears GR1 rotate about the first rotational axis RX1 in the counterclockwise direction, the inner roller IRL connected to the first gears GR1 may be rotated about the first rotational axis RX1 in the counterclockwise direction. Accordingly, the first roller ROL1 and the inner roller IRL may be rotated about the first rotational axis RX1 in a same direction as each other.

The one end of the first elastic body SPR1 connected to the inner roller IRL may be rotated. The other end of the first elastic body SPR1 connected to the first roller ROL1 may be rotated. As the inner roller IRL and the first roller ROL1 rotate about the first rotational axis RX1 in a same direction as each other, a difference in speed of rotation, e.g., RPM, between the first roller ROL1 and the inner roller IRL may be reduced.

If the inner roller IRL does not rotate in a same direction as the first roller ROL1 about the first rotational axis RX1, the elastic force of the first elastic body SPR1 may be increased. When the elastic force of the first elastic body SPR1 is increased, the elastic force may be transmitted to the display module DM. Therefore, the display module DM may be damaged.

In an embodiment of the invention, as the difference in speed of rotation between the first roller ROL1 and the inner roller IRL is reduced, the elastic force of the first elastic body SPR1 may remain constant when the display module DM is wound. Thus, a possibility of damage to the display module DM may be reduced.

Figure 17A:
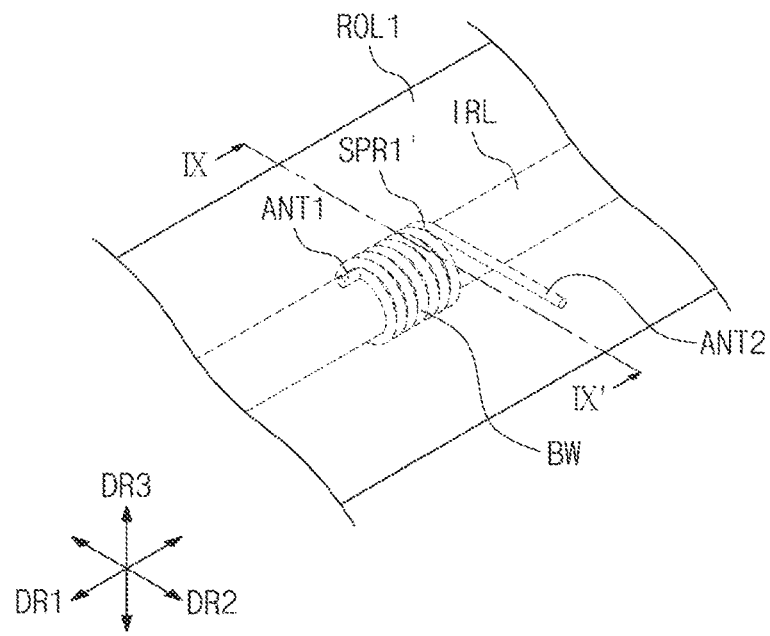
FIGS. 17A and 17B are views illustrating a first elastic body according to an embodiment.
Figure 17B:
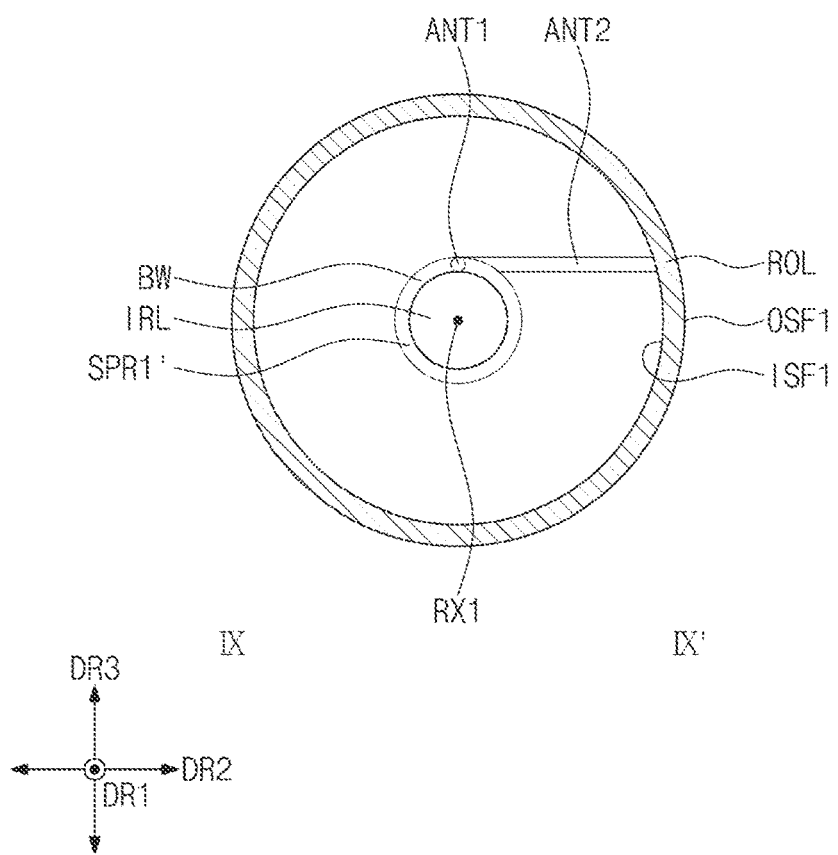

FIGS. 17A and 17B are views illustrating a first elastic body according to an embodiment.

Particularly, FIG. 17A is a perspective view, and FIG. 17B is a sectional view taken along line IX-IX' illustrated in FIG. 17A.

The first roller ROL1 and the inner roller IRL of FIGS. 17A and 17B are substantially the same as the first roller ROL1 and the inner roller IRL of FIGS. 10 and 11 and therefore, any repetitive detailed description thereof will be omitted or simplified.

Referring to FIGS. 15A, 16A, 17A, and 17B, in an embodiment, the first elastic body SPR1' may be a torsion spring. The first elastic body SPR1' may include a first antenna ANT1, a second antenna ANT2, and a helical portion BW. The first antenna ANT1 may extend in the first direction DR1 and may be connected to the inner roller IRL. The helical portion BW may surround the inner roller IRL. The second antenna ANT2 may extend in the second direction DR2 and may be connected to the first inner circumferential surface ISF1.

When the display module DM and the support parts SUP are wound and unwound, the first roller ROL1 and the inner roller IRL may be rotated about the first rotational axis RX1 in a same direction as each other. Accordingly, the elastic force of the first elastic body SPR1' may remain constant. Thus, a possibility of damage to the display module DM due to an excessive elastic force of the first elastic body SPR1' may be reduced.

According to embodiments of the disclosure, when the first roller provided with the first tunnel defined therein rotates about the first rotational axis parallel to the first direction, the inner roller disposed in the first tunnel may rotate about the first rotational axis. Accordingly, the elastic force of the first elastic body connected to the first roller and the inner roller may remain constant, and damage to the display panel by the elastic force may be effectively prevented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
  a first roller extending in a first direction and provided with a first tunnel defined therein to extend in the first direction, wherein the first roller rotates about a first rotational axis parallel to the first direction;
  a display module connected to the first roller and wound around and unwound from the first roller;
  an inner roller extending in the first direction and disposed in the first tunnel, wherein the inner roller rotates about the first rotational axis;
  a first gear connected to each of opposite sides of the inner roller in the first direction, wherein the first gear is disposed on an outer surface of the first roller; and
  a first elastic body disposed in the first tunnel and connected to the inner roller and the first roller.

2. The display device of claim 1, wherein the first roller and the inner roller rotate in a same direction.

3. The display device of claim 1, further comprising:
  a second roller extending in the first direction and spaced apart from the first roller in a second direction crossing the first direction, wherein the second roller is provided with a second tunnel defined therein to extend in the first direction;
  a support part connected to the second roller and disposed under the display module, wherein the support part is wound around and unwound from the second roller;
  a second gear connected to each of opposite sides of the second roller in the first direction;
  a fixed bar extending in the first direction and disposed in the second tunnel; and
  a second elastic body disposed in the second tunnel and connected to the second roller and the fixed bar.

4. The display device of claim 3, wherein
  the second roller rotates in a same direction as the first roller about a second rotational axis parallel to the first direction, and
  the fixed bar does not rotate.

5. The display device of claim 3, wherein an unwound portion of the support part, when viewed in the second direction, is in a shape convexly curved upward.

6. The display device of claim 3, further comprising:
  a third roller extending in the first direction and disposed between the first roller and the second roller; and
  a third gear disposed on each of opposite sides of the third roller in the first direction,
  wherein the third gear is disposed between the first gear and the second gear and engaged with the first gear and the second gear.

7. The display device of claim 6, wherein the third roller rotates about a third rotational axis parallel to the first direction in a direction opposite to a direction in which the first roller and the second roller rotate.

8. The display device of claim 6, further comprising:
  a housing which accommodates the first roller, the second roller, and the third roller; and
  a handle connected to at least one selected from the display module and the support part.

9. The display device of claim 8, further comprising:
  a first protrusion extending from the first gear in the first direction;
  a second protrusion extending from the second gear in the first direction; and
  a third protrusion extending from the third gear in the first direction,
  wherein the first, second, and third protrusions are disposed in fastening recesses defined on the housing.

10. The display device of claim 8, wherein the fixed bar penetrates the second gear and is connected to the housing.

11. The display device of claim 3, wherein one end of the second elastic body passes through a fixed opening defined through the fixed bar and is connected to an outer surface of the fixed bar, and
wherein an opposite end of the second elastic body is connected to an inner circumferential surface of the second roller.

12. The display device of claim 1, wherein one end of the first elastic body is connected to the inner roller, and an opposite end of the first elastic body is connected to an inner circumferential surface of the first roller.

13. The display device of claim 12, wherein the first elastic body includes a spiral spring.

14. The display device of claim 12, wherein the first elastic body includes a torsion spring.

15. The display device of claim 14, wherein the torsion spring includes:
a helical portion surrounding the inner roller;
a first antenna extending from one side of the helical portion in the first direction and connected to the inner roller; and
a second antenna extending from an opposite side of the helical portion in a second direction crossing the first direction and connected to the inner circumferential surface of the first roller.

16. A display device comprising:
a first roller part extending in a first direction;
a display module connected to the first roller part and wound around and unwound from the first roller part;
a second roller part extending in the first direction and spaced apart from the first roller part in a second direction crossing the first direction, wherein the second roller part includes a second gear disposed on each of opposite sides thereof in the first direction; and
a third roller part extending in the first direction and disposed between the first roller part and the second roller part, wherein the third roller part includes a third gear disposed on each of opposite sides thereof in the first direction,
wherein the first roller part includes:
a first roller provided with a first tunnel defined therein to extend in the first direction, wherein the first roller rotates about a first rotational axis parallel to the first direction;
an inner roller disposed in the first tunnel and extending in the first direction;
a first gear connected to each of opposite sides of the inner roller in the first direction, wherein the first gear is disposed on an outer surface of the first roller; and
a first elastic body disposed in the first tunnel and connected to the inner roller and the first roller, and
wherein the first, second, and third gears are engaged with each other to rotate.

17. The display device of claim 16, wherein the inner roller rotates in a same direction as the first roller about the first rotational axis.

18. The display device of claim 16, wherein the first and second gears rotate in a same direction as each other, and the third gear rotate in a direction opposite to the direction in which the first and second gears rotate.

19. The display device of claim 16, wherein the second roller part includes:
a second roller provided with a second tunnel defined therein to extend in the first direction;
a support part connected to the second roller and disposed under the display module, wherein the support part is wound around and unwound from the second roller;
a fixed bar disposed in the second tunnel; and
a second elastic body disposed in the second tunnel and connected to the second roller and the fixed bar.

20. The display device of claim 19, wherein the second roller rotates about a second rotational axis parallel to the first direction, and
wherein the fixed bar does not rotate about the second rotational axis.

21. An electronic device for providing an image comprising:
a display device comprising:
a first roller extending in a first direction and provided with a first tunnel defined therein to extend in the first direction, wherein the first roller rotates about a first rotational axis parallel to the first direction;
a display module connected to the first roller and wound around and unwound from the first roller;
an inner roller extending in the first direction and disposed in the first tunnel, wherein the inner roller rotates about the first rotational axis;
a first gear connected to each of opposite sides of the inner roller in the first direction, wherein the first gear is disposed on an outer surface of the first roller; and
a first elastic body disposed in the first tunnel and connected to the inner roller and the first roller.

* * * * *